(12) United States Patent
Koo et al.

(10) Patent No.: US 10,488,559 B2
(45) Date of Patent: Nov. 26, 2019

(54) ANTI-REFLECTIVE FILM, ELECTRONIC DEVICE INCLUDING THE SAME, AND APPARATUS FOR AND METHOD OF MANUFACTURING THE SAME

(71) Applicant: SAMSUNG ELECTRONICS CO., LTD., Suwon-si, Gyeonggi-do (KR)

(72) Inventors: Nam-il Koo, Hwaseong-si (KR); Min-Seok Choi, Hwaseong-si (KR); Eui-sun Choi, Seoul (KR); Hyung-kyu Lee, Seoul (KR); Ji-min Lee, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 515 days.

(21) Appl. No.: 15/073,815

(22) Filed: Mar. 18, 2016

(65) Prior Publication Data
US 2016/0370505 A1  Dec. 22, 2016

(30) Foreign Application Priority Data
Jun. 19, 2015  (KR) .......................... 10-2015-0087589

(51) Int. Cl.
*G02B 1/118* (2015.01)
*H01L 27/146* (2006.01)
*G02B 1/14* (2015.01)

(52) U.S. Cl.
CPC .............. *G02B 1/118* (2013.01); *G02B 1/14* (2015.01); *H01L 27/1462* (2013.01); *H01L 27/14618* (2013.01); *H01L 27/14625* (2013.01); *H01L 27/14685* (2013.01); *H01L 2224/48091* (2013.01); *H01L 2224/73265* (2013.01); *H01L 2924/181* (2013.01); *H01L 2924/1815* (2013.01)

(58) Field of Classification Search
CPC ................................................ G02B 1/00–118
See application file for complete search history.

(56) References Cited

U.S. PATENT DOCUMENTS

| | | | | |
|---|---|---|---|---|
| 7,626,772 | B2 * | 12/2009 | Nakai | ...................... G02B 1/14 359/793 |
| 7,859,627 | B2 * | 12/2010 | Nishida | .................. G02B 1/118 349/137 |
| 8,431,004 | B2 | 4/2013 | Taguchi et al. | |

(Continued)

FOREIGN PATENT DOCUMENTS

| | | |
|---|---|---|
| JP | 2012-199098 A | 10/2012 |
| JP | 2012-204489 A | 10/2012 |

(Continued)

OTHER PUBLICATIONS

"New wind in nanoimprint lithography, Applications are also expanded through a large area" pp. 49-58 and English Translation pp. 1-13, Nikkei Elecronics Mar. 17, 2014.

(Continued)

*Primary Examiner* — William R Alexander
*Assistant Examiner* — Jeffrey E Madonna
(74) *Attorney, Agent, or Firm* — Lee & Morse, P.C.

(57) ABSTRACT

An anti-reflective film includes a transparent substrate, and a high hardness coating layer on at least one surface of the transparent substrate, the high hardness coating layer having a hardness of about 4 H or higher and a moth-eye pattern.

20 Claims, 49 Drawing Sheets

(56) References Cited

U.S. PATENT DOCUMENTS

| | | | |
|---|---|---|---|
| 8,698,272 B2 | 4/2014 | Vineis et al. | |
| 8,841,836 B2 | 9/2014 | Kim et al. | |
| 2006/0132922 A1* | 6/2006 | Takao | G02B 1/10 |
| | | | 359/601 |
| 2007/0268587 A1* | 11/2007 | Ninomiya | G02B 1/105 |
| | | | 359/601 |
| 2008/0151376 A1* | 6/2008 | Suzuki | G02B 1/111 |
| | | | 359/599 |
| 2010/0165276 A1* | 7/2010 | David | G02B 1/118 |
| | | | 349/122 |
| 2014/0063607 A1* | 3/2014 | Fukuda | G02B 27/42 |
| | | | 359/601 |
| 2014/0166101 A1 | 6/2014 | Myoung et al. | |
| 2014/0261677 A1 | 9/2014 | Sakamoto et al. | |
| 2015/0077646 A1 | 3/2015 | Chen et al. | |

FOREIGN PATENT DOCUMENTS

| | | |
|---|---|---|
| JP | 2015-029054 A | 2/2015 |
| KR | 10-2009-0099269 A | 9/2009 |
| KR | 10-2011-0009990 A | 1/2011 |
| KR | 10-2012-0009542 A | 2/2012 |

OTHER PUBLICATIONS

Eric Slivka, "iPad Air 2 Display Praised for Antireflective Coating, but iPad Mini 3 Display Still Lags" www.marcrumors.com/2014/10/27/ipad-air-2-mini-3-displays/, Monday, Oct. 27, 2014, 7:32 am PDT.

\* cited by examiner

ANTI-REFLECTIVE FILM, ELECTRONIC DEVICE INCLUDING THE SAME, AND APPARATUS FOR AND METHOD OF MANUFACTURING THE SAME

CROSS-REFERENCE TO RELATED APPLICATION

Korean Patent Application No. 10-2015-0087589, filed on Jun. 19, 2015, in the Korean Intellectual Property Office, and entitled: "Anti-Reflective Film, Electronic Device Including the Same, and Apparatus for and Method of Manufacturing the Same," is incorporated by reference herein in its entirety.

BACKGROUND

1. Field

Embodiments relate to an optical film, and more particularly, to an anti-reflective film capable of preventing reflection of light, an electronic device including the same, and an apparatus for and a method of manufacturing the same.

2. Description of the Related Art

Generally, an anti-reflective film may be attached to a cover glass of a camera device or a display screen of a display device so as to prevent reflection of light. The anti-reflective film may prevent a ghost phenomenon and an image blur phenomenon in the camera device, and may reduce the incidence of external incident light in the display device, thereby the display device being able to output clear light and to obtain a clear color. Examples of the anti-reflective film include an anti-glare (AG) type anti-reflective film and an anti-reflection (AR) type anti-reflective film. Regarding the AG type anti-reflective film, an uneven structure may be formed on a surface thereof to reduce reflectance of light by preventing regular reflection of light. Regarding the AR type anti-reflective film, the reflectivity may be reduced by using an interference effect of light according to a refractive index and a thickness of a medium.

SUMMARY

Embodiments provide an anti-reflective film and an electronic device including the same, where the anti-reflective film includes a moth-eye structure and exhibits a high hardness to solve a limitation in mechanical abrasion.

Embodiments also provide an apparatus and a method of manufacturing an anti-reflective film, whereby the anti-reflective film includes a moth-eye structure and exhibits a high hardness, thereby facilitating manufacturing.

According to an aspect of embodiments, there is provided an anti-reflective film including a transparent substrate, and a high hardness coating layer on at least one surface of the transparent substrate, the high hardness coating layer having a hardness of about 4 H or higher and a moth-eye pattern.

The anti-reflective film may further include a protection layer on the high hardness coating layer, the protection layer having a hardness equal to or greater than the hardness of the high hardness coating layer.

The protection layer may include a first protection layer and a second protection layer, the first protection layer tracing an upper surface shape of the moth-eye pattern, and the second protection layer is on the first protection layer and fills a concave portion of the first protection layer.

An upper surface of the second protection layer may be flat.

An upper surface of the second protection layer may correspond to a convex portion and the concave portion of the first protection layer.

The second protection layer may have a refractive index lower than a refractive index of the first protection layer.

The protection layer may be on the high hardness coating layer, and the anti-reflective film may further include an adhesion layer a surface of the transparent substrate opposite the high hardness coating layer, and a removable third protection layer on each of the adhesion layer and the protection layer.

The high hardness coating layer may include at least one of a siloxane-based material, a polysilazane-based material, a polymethylmethacrylate (PMMA)-based material, a spin on glass (SOG), and a spin on dielectric (SOD), and the siloxane-based material may include epoxy.

According to another aspect of embodiments, there is provided an electronic device including at least one semiconductor chip, a printed circuit board (PCB), the at least one semiconductor chip being on the PCB, a holder on the PCB and surrounding the semiconductor chip, the holder including an open region, and an anti-reflective film on the holder to cover the open region in the holder, the anti-reflective film including a transparent substrate, and a high hardness coating layer on at least one of first and second surfaces of the transparent substrate, the high hardness coating layer having a hardness of about 4H or higher and a moth-eye pattern.

The first surface of the transparent substrate may face the semiconductor chip, the high hardness coating layer may be on each of the first and second surfaces of the transparent substrate, and the anti-reflective film may further include a protection layer on the high hardness coating layer above the second surface of the transparent substrate.

The protection layer may include a first protection layer and a second protection layer, the first protection layer may trace an upper surface shape of the moth-eye pattern, the second protection layer may be on the first protection layer, the second protection layer filling a concave portion of the first protection layer and covering a convex portion of the first protection layer, and the second protection layer may include a first portion corresponding to the concave portion and a second portion corresponding to the convex portion.

In the second protection layer, a height of an upper surface in the second portion may be equal to or greater than a height of an upper surface in the first portion with respect to the second surface of the transparent substrate.

The first protection layer may have a uniform thickness, and the second protection layer has a refractive index less than a refractive index of the first protection layer.

The electronic device may further include a transparent cover layer on the holder, the anti-reflective film being attached to the transparent cover layer through an adhesion layer.

The electronic device may be a camera device, a display device, or a camera-display device.

The electronic device may be a camera device including a CMOS image sensor (CIS) and a charge coupled device (CCD), and the anti-reflective film may define a transparent cover layer of the camera through which light is input.

The electronic device may be a display device including a smartphone, a tablet PC, a flexible mobile device, or a wearable device, and the anti-reflective film may define a transparent cover layer of the display panel through which an image is output.

According to yet another aspect of embodiments, there is provided a method of manufacturing an anti-reflective film including preparing a coating substrate including a coating layer on at least one of first and second surfaces of a transparent substrate, transferring a moth-eye pattern onto the coating layer by using a stamp including the moth eye pattern, and forming a high-hardness coating layer by curing the coating layer using pulsed ultraviolet (UV) light.

Preparing the coating substrate may include disposing the transparent substrate on a support substrate, and forming the coating layer on the first surface of the transparent substrate.

Preparing the coating substrate may include simultaneously forming the coating layer on each of the first and second surfaces of the transparent substrate via different coating processes.

The stamp may have belt shape, and transferring the moth-eye pattern onto the coating layer may include imprinting the moth-eye pattern on the coating layer by pressing the stamp onto the coating layer using a roller of a first rolling system.

Forming the high hardness coating layer may include performing curing while a UV lamp follows the roller.

Before transferring the moth-eye pattern onto the coating layer, the stamp may be manufactured by transferring the moth-eye pattern onto an initial stamp using a second rolling stamp, and sequentially, the moth-eye pattern is transferred onto the coating layer by using the manufactured stamp.

The method may further include forming a protection layer on the high hardness coating layer.

According to still another aspect of embodiments, there is provided an apparatus for manufacturing an anti-reflective film including a support substrate to support a coating substrate, the coating substrate including a transparent substrate and a coating layer on the transparent substrate, a stamp including a moth-eye pattern, a first rolling system to supply the stamp onto an upper portion of the support substrate, the first rolling system including a roller to press the stamp onto the coating layer and to imprint the moth-eye pattern of the stamp onto the coating layer, and a pulsed ultraviolet (UV) lamp to follow the roller and to cure the coating layer.

The may further include a coating device to form the coating layer on the transparent substrate.

The apparatus may further include a second rolling system at a front end of the first rolling system to transfer the moth-eye pattern onto an initial stamp to manufacture the stamp, before supplying of the stamp to the first rolling system.

According to yet another aspect of embodiments, there is provided an apparatus for manufacturing an anti-reflective film including a moving device to support and move a coating substrate, the coating substrate including a first coating layer on an upper surface of a transparent substrate and a second coating layer on a lower surface thereof, a first stamp including a first moth-eye pattern, a second stamp including a second moth-eye pattern, a first upper rolling system to supply the first stamp on an upper portion of the coating substrate, the first upper rolling system including an upper roller to press the first stamp onto the first coating layer and to imprint the first moth-eye pattern of the first stamp onto the first coating layer, a first lower rolling system to supply the second stamp to a lower portion of the coating substrate, the first lower rolling system including a lower roller to press the second stamp onto the second coating layer and to imprint the second moth-eye pattern of the second stamp onto the second coating layer, a first pulsed ultraviolet (UV) lamp to follow the upper roller and to cure the first coating into a first high hardness coating layer, and a second pulsed UV lamp to follow the lower roller and to cure the second coating layer into a second high hardness coating layer, the first and second pulsed UV lamps being operable simultaneously to cure the first and second coating simultaneously.

The apparatus may further include a first coating device to coat the first coating layer on the upper surface of the transparent substrate, and a second coating device to coat the second coating layer on the lower surface of the transparent substrate, wherein, after coating the first and second coating layers, the transparent substrate is movable to the first upper and lower rolling systems by the moving device.

The first and second coating devices may be of different types.

The apparatus may further include a second upper rolling system at a front end of the first upper rolling system to transfer the first moth-eye pattern onto a first initial stamp, and to manufacture the first stamp, and a second lower rolling system at a front end of the first lower rolling system to transfer the second moth-eye pattern onto a second initial stamp, and to manufacture the second stamp, wherein the manufacturing of the first stamp, the supplying of the first stamp to the first upper rolling system, the manufacturing of the second stamp, and the supplying of the second stamp to the first lower rolling system are sequentially performed.

According to still another aspect of embodiments, there is provided an anti-reflective film, including a transparent substrate, and a high hardness coating layer on at least one surface of the transparent substrate, the high hardness coating layer including a plurality of protrusions arranged in a matrix pattern and facing away from the transparent substrate, the entirety of the high hardness coating layer exhibiting a hardness of at least 4H.

The high hardness coating layer may include the plurality of protrusions on a base layer, the plurality of protrusions and base layer having a uniform hardness of above 4H.

The plurality of protrusions and the base layer may be formed of a same material and are integral with each other.

The high hardness coating layer may include at least one of a polysilazane-based material, a polymethylmethacrylate (PMMA)-based material, a spin on glass (SOG), a spin on dielectric (SOD), and a siloxane-based material with an epoxy group.

The high hardness coating layer is directly on the transparent substrate, and the plurality of protrusions in the high hardness coating layer have uniform dimensions and pitch.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
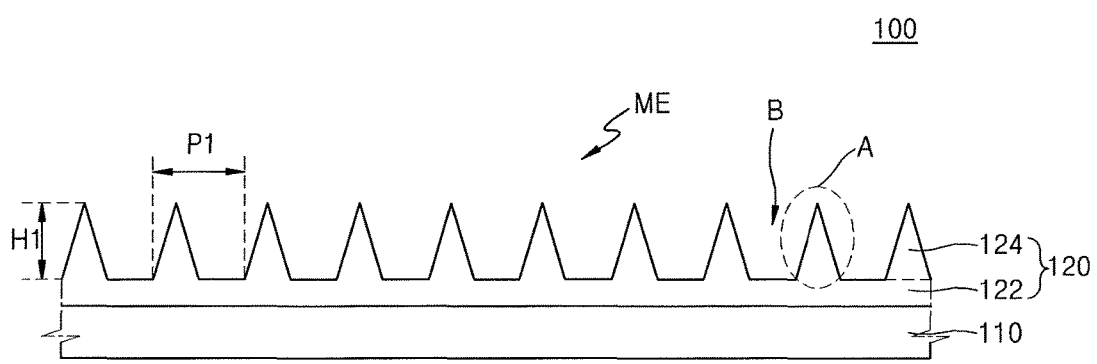
FIG. 1 illustrates a cross-sectional view of an anti-reflective film according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. As used herein, the term "and/or" includes any and all combinations of one or more of the associated listed. Expressions such as "at least one of" when preceding a list of elements, modify the entire list of elements and do not modify the individual elements of the list.

In the drawing figures, the dimensions of layers and regions may be exaggerated for clarity of illustration. It will also be understood that when a layer or element is referred to as being "on", "connected to" or "coupled to" another element, it may be directly on, connected or coupled to the other element or intervening elements may be present. In addition, it will also be understood that when a layer is referred to as being "between" two layers, it can be the only layer between the two layers, or one or more intervening layers may also be present. Like reference numerals refer to like elements throughout. The terms used in the present specification are merely used to describe particular embodiments, and are not intended to limit.

FIG. 1 is a cross-sectional view of an anti-reflective film 100 according to an exemplary embodiment.

Referring to FIG. 1, the anti-reflective film 100 according to the present exemplary embodiment may include a transparent substrate 110 and a high hardness coating layer 120.

The transparent substrate 110 may be a support layer configured to form a body of the anti-reflective film 100, and may have a high transmittance and be visually transparent. In particular, the transparent substrate 110 may have a high transmittance with respect to a visible ray region but is not limited thereto. For example, the transparent substrate 110 may also have a high transmittance with respect to an infrared ray region or an ultraviolet ray region. The transparent substrate 110 may have a medium level of refractive index. For example, the transparent substrate 110 may have a refractive index of about 1.45 to about 1.5 with respect to a wavelength of 600 nm. However, the refractive index of the transparent substrate 110 is not limited to the above numerical values.

For reference, a refractive index may be classified into an absolute refractive index with respect to a vacuum and a relative refractive index with respect to a medium, which is different from the absolute refractive index. Generally, assuming that refractive indexes of water and glass are respectively about 1.33 and about 1.5, the refractive index may mean the absolute refractive index. A refractive index varies according to a wavelength. For example, the refractive index is increased as the wavelength is shortened. Therefore, when the refractive index is defined, a wavelength of about 589.29 nm corresponding to a sodium D-line may be used as a reference wavelength. The wavelength of about 589.29 nm will not be accurately mentioned for convenience, and a wavelength of about 600 nm will be often mentioned. In addition, the terms "low refractive index and high refractive index" will be often used, and with respect to a refractive index of about 1.5 corresponding to a refractive index of glass, a refractive index of less than about 1.5 may be referred to as a low refractive index and a refractive index of about 1.5 or more may be referred to as a high refractive index. As described above, the refractive index of about 1.5 will be referred to as a medium refractive index. Of course, a concept of the low refractive index or the high refractive index is not limited to the above-described reference. For example, a low refractive index or a high refractive index may be a merely relative concept.

The transparent substrate 110 may include a transparent material that has characteristics such as a heat resistance, a chemical resistance, and a high hardness. For example, the transparent substrate 110 may include at least one of a tempered glass, a transparent film, fused silica, quartz, glass, a polymer, and a glass wafer. However, a material of the transparent substrate 110 is not limited to the above materials.

The transparent substrate 110 may be used as an outer transparent cover layer of an electronic device, e.g., a camera device or a display device. Accordingly, the transparent substrate 110 may have a certain degree of thickness to function as a support layer. For example, the transparent substrate 110 may have a thickness of about 0.5 mm. However, the thickness of the transparent substrate 110 is not limited to the above numerical value. For example, the transparent substrate 110 may be thicker or thinner than about 0.5 mm. When the anti-reflective film 100 is attached to a separate transparent cover layer, e.g., a cover glass, the transparent substrate 110 may be very thinly formed so as to have a thickness of about 0.1 mm or less.

The high hardness coating layer 120 may be disposed, e.g., directly, on the transparent substrate 110 and may include a moth-eye pattern ME on a surface thereof, e.g., the moth-eye pattern ME may include a plurality of protrusions having a pitch smaller than the wavelength of visible light and are spaced apart from each other in two directions to have a matrix pattern. In detail, the high hardness coating layer 120 may include a base layer 122 and a protrusion 124, e.g., a plurality of protrusions 124 on the base layer 120. A material of the base layer 122 may be substantially the same as a material of the protrusion 124, and the base layer 122 may be omitted in some cases.

The protrusion 124 may have a constant pitch and may be uniformly disposed on the base layer 122 to form the moth-eye pattern ME. Therefore, the moth-eye pattern ME may include a convex portion A corresponding to the protrusion 124 and a concave portion B between adjacent convex portions A. In order to form the moth-eye pattern ME, the protrusion 124 may be disposed so as to have, e.g., a first height H1 and a first pitch P1. For example, the first height H1 may be about 280 nm, and the first pitch P1 may be about 250 nm. However, the first height H1 and the first pitch P1 of the protrusion 124 are not limited to the above numerical values.

Figure 3:
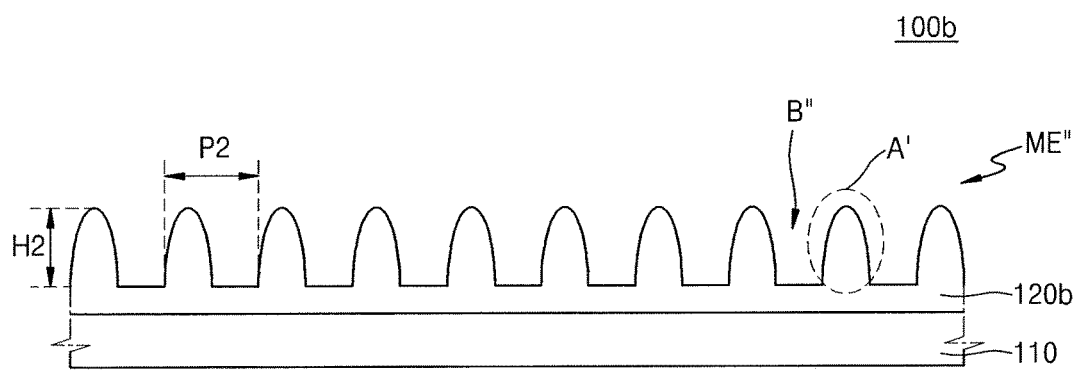

The protrusion 124 may have a cone shape, but is not limited to the cone shape, e.g., may have a polypyramid shape. In addition, as illustrated in FIG. 3, an upper portion of the protrusion 124 may have a round projection shape rather than a horn shape. The protrusion 124 is not limited to the above shapes and may have any convenient shape to efficiently prevent reflection of light through the moth-eye pattern ME.

For reference, a principle of preventing the reflection of light through the moth-eye pattern ME may be as follows. Reflection of light may be generated at an interface at which a refractive index varies abruptly, e.g., rapidly, while gentle variation of the refractive index may decrease reflection. When a period, e.g., pitch, of a microscopic structure is less than a diffraction limit of $\lambda/2$ to $\lambda$, (where $\lambda$ is a wavelength of light), light may not recognize the, e.g., contours of the, structure in detail, but rather recognize a composite medium, e.g., defined by the microscopic structure and air, as a homogeneous medium. Therefore, due to the characteristics of light, moth-eye pattern, which has a pitch less than or equal to light wavelength, may be implemented as a material having a low refractive index to minimize the reflection of light.

In the anti-reflective film 100 according to the present exemplary embodiment, the high hardness coating layer 120 may have a high hardness. For example, the high hardness coating layer 120 may have a hardness of about 4H or more. The hardness of about 4H may mean a hardness value obtained through a scratch test by using a pencil. In the anti-reflective film 100 according to the present exemplary embodiment, the high hardness coating layer 120 may have a hardness of about 5H to about 6H. However, the hardness of the high hardness coating layer 120 is not limited to the above numerical values, e.g., the high hardness coating layer 120 may have a hardness of about 8H to about 9H that is a degree of a hardness in a tampered glass.

In order to obtain the high hardness as described above, the high hardness coating layer 120 may include at least one of a siloxane-based material, a polysilazanes-based material, a polymethylmethacrylate (PMMA)-based material, spin on glass (SOG), and spin on dielectric (SOD). The siloxane-based material may include epoxy so as to increase the hardness.

The polysilazane-based material may have strong mechanical durability to such an extent as to be used in coating a vehicle glass film and may be a heat resistant material that has a melting point of about 800° C. When the high hardness coating layer 120 is formed based on the polysilazane-based material, a high hardness of about 8H may be implemented. For example, when forming the high hardness coating layer 120 based on the polysilazane-based material, after a material based on polysilazane is prepared and is sintered, a bond of $SiO_2$ or Si—C may be formed, and a concentration of polysilazane to be added to a diluent may be in the range of about 3 wt % to about 70 wt %, based on a total weight of the polysilazane with the diluent, and may be changed according to a required thickness. The diluent may include at least one of, e.g., propylene glycol monomethyl ether acetate (PGMEA) and iso-propoxyethanol.

In the anti-reflective film 100 according to the present exemplary embodiment, as described above, the high hardness coating layer 120 may include the moth-eye pattern ME on the surface thereof. Therefore, an appropriate heat-treatment and/or a hardening treatment may be performed so as to form the moth-eye pattern ME on the surface of the high hardness coating layer 120 and also implement a high hardness. The heat-treatment and/or the hardening treatment will be described in more detail with reference to FIGS. 29A to 37.

The high hardness coating layer 120, on which the moth-eye pattern ME is formed, is applied as a surface of the anti-reflective film 100 according to the present exemplary embodiment, so that the anti-reflective film 100 may efficiently prevent the reflection of light and may have a high transmittance of 99% or more, a high hardness of about 4H or more, an excellent wear resistance, and an excellent chemical resistance. In other words, when the anti-reflective film 100 according to the present exemplary embodiment is used as a transparent cover layer of an electronic device, e.g., a camera device or a display device, the high hardness of the anti-reflective film 100 efficiently prevents mechanical abrasion caused by an external touch (e.g., of a user) or a scratch thereof, e.g., despite the nano-sized protrusions in the high hardness coating layer 120, as well as efficiently preventing the reflection of light, thereby substantially improving performance of the camera device or the display device.

Figure 2:
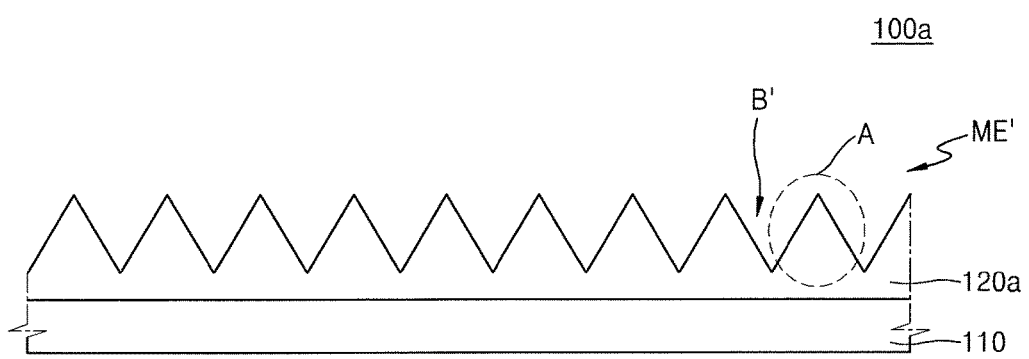
FIGS. 2 and 3 illustrate cross-sectional views of anti-reflective films according to other exemplary embodiments.

FIGS. 2 and 3 are cross-sectional views of anti-reflective films 100a and 100b according to other exemplary embodiments. The description provided in FIG. 1 will be simplified or omitted for convenience in description.

Referring to FIG. 2, the anti-reflective film 100a according to the present exemplary embodiment may differ from the anti-reflective film 100 of FIG. 1 in terms of a structure of a high hardness coating layer 120a. For example, in the high hardness coating layer 120a of the anti-reflective film 100a according to the present exemplary embodiment, a cross-sectional structure of a convex portion A in a moth-eye pattern ME' may be similar to a cross-sectional structure of a concave portion B' in the moth-eye pattern ME'.

More specifically, in the high hardness coating layer 120 of the anti-reflective film 100 in FIG. 1, a cross-sectional structure of the concave portion B in the moth-eye pattern ME may have an inverted trapezoidal shape. In contrast, in the high hardness coating layer 120a of the anti-reflective film 100a according to the present exemplary embodiment, the cross-sectional structure of the concave portion B1 in the moth-eye pattern ME' may have an inverted triangular shape. Therefore, the cross section of the concave portion B' may be similar to the cross section of the convex portion A having a triangular cross section, except that a direction of a vortex in the concave portion B' is different from a direction of a vortex in the convex portion A. A three-dimensional (3D) structure of the convex portion A may be different from a 31) structure of the concave portion B' in terms of a whole 3D structure of the moth-eye pattern ME'. For example, the 3D structure of the convex portion A may have a cone or polypyramid structure, and the 3D structure of the concave portion B' may not have a horn structure. A material and a hardness of the high hardness coating layer 120a may be substantially the same as those described in the anti-reflective film 100 of FIG. 1.

Referring to FIG. 3, the anti-reflective film 100b according to the present exemplary embodiment may differ from the anti-reflective film 100 of FIG. 1 in terms of a structure of a high hardness coating layer 120b. For example, a structure of moth-eye pattern ME" of the high hardness coating layer 120b according to the present exemplary embodiment may be different from a structure of the moth-eye pattern ME of the high hardness coating layer 120 in the anti-reflective film 100 of FIG. 1.

Specifically, in the high hardness coating layer 120b of the anti-reflective film 100b according to the present exemplary embodiment, an upper portion of a convex portion A' constituting the moth-eye pattern ME" may have a dome shape. In addition, as a shape of the convex portion A' is different from a shape of the convex portion A in the anti-reflective film 100 of FIG. 1, a shape of a concave portion B" may also be different from a shape of the concave portion B in the anti-reflective film 100 of FIG. 1.

The convex portions A' of the moth-eye pattern ME" may have a second height H2 and may be disposed at a second pitch P2. The second height H2 may be substantially the same as the first height H1 of the anti-reflective film 100 of FIG. 1. The second pitch P2 may also be substantially the same as the first pitch P1 of the anti-reflective film 100 of FIG. 1. However, the second height H2 and the second pitch P2 are not limited to the above description. For example, the second height H2 may be different from the first height H1, or the second pitch P2 may be different from the first pitch P1. In addition, the second height H2 and the second pitch P2 may be different from the first height H1 and the first pitch P1, respectively.

Since the upper portion of the convex portion A' constituting the moth-eye pattern ME" is formed in a round curved shape, the anti-reflective film 100b according to the present exemplary embodiment may be further strengthened in terms of a wear resistance. A material of the high hardness coating layer 120b may be substantially the same as that described in the anti-reflective film 100 of FIG. 1.

Several types of moth-eye pattern structures have been described as examples. However, according to the present exemplary embodiments, the moth-eye pattern structures of the anti-reflective films are not limited to the examples. For example, in the anti-reflective films according to the exemplary embodiments, since the moth-eye pattern needs only to have a pitch of a diffraction limit or less and be uniformly formed, the concave portion and the convex portion constituting the moth-eye pattern may be formed so as to have various shapes. The moth-eye pattern may be formed in a shape that is easily formed, in terms of a manufacturing process. However, a reflectance and a wear resistance may be slightly changed according to a specific structure of the moth-eye pattern. Therefore, the specific structure of the moth-eye pattern may be determined according to characteristics such as a required reflectance and wear resistance.

Figure 4A:
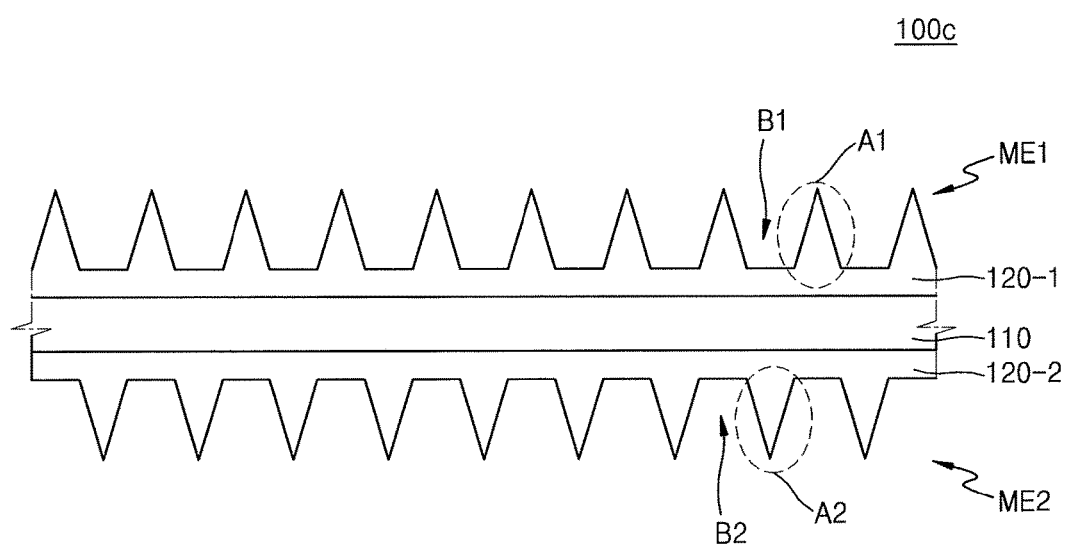
FIGS. 4A to 4C illustrate cross-sectional views of anti-reflective films according to other exemplary embodiments.
Figure 4B:
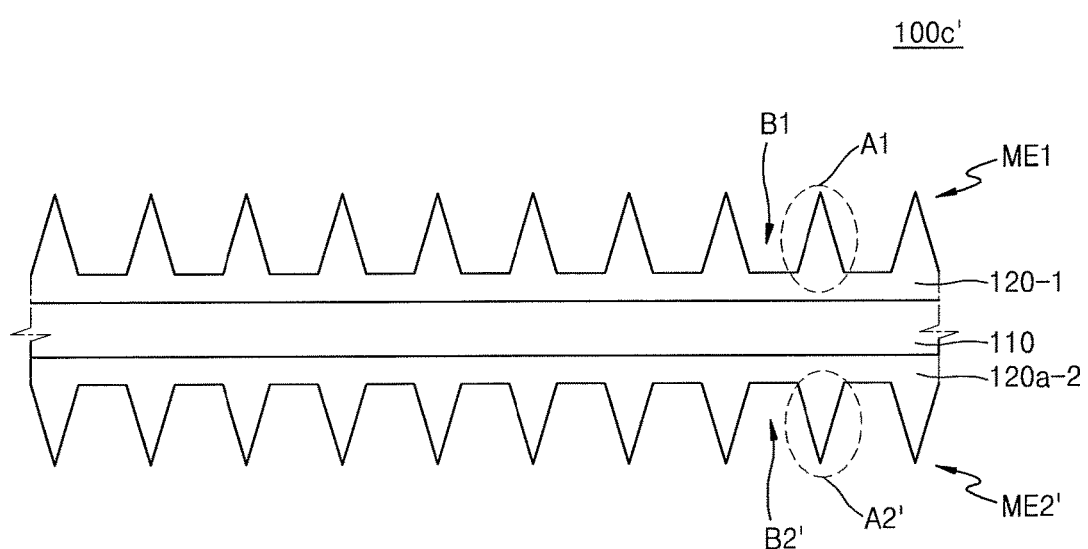
Figure 4C:
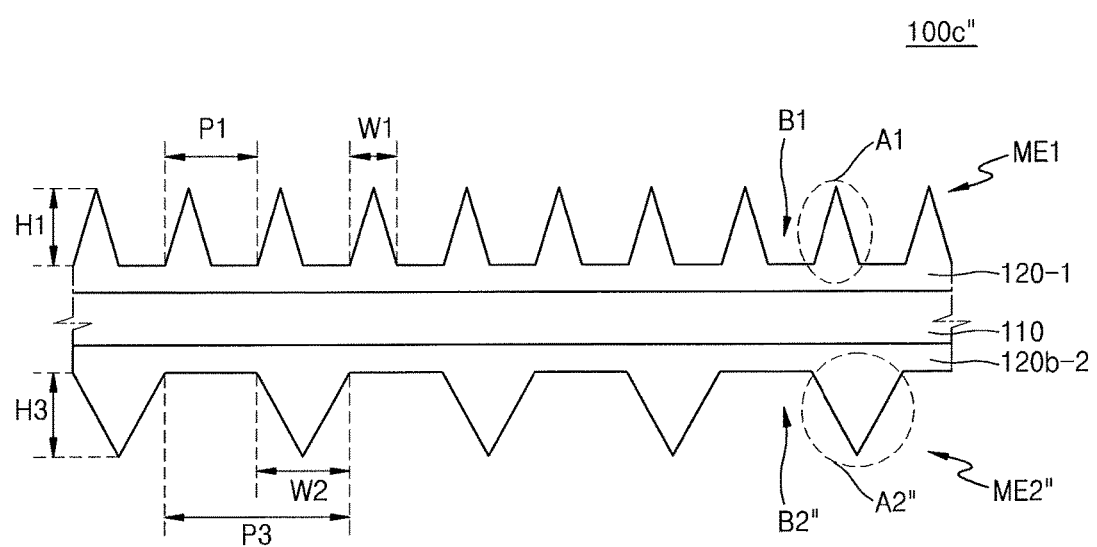

FIGS. 4A to 4C are cross-sectional views of anti-reflective films 100c, 100c', and 100c" according to other exemplary embodiments. The description provided in FIG. 1 will be simplified or omitted for convenience in description.

Referring to FIG. 4A, the anti-reflective film 100c according to the present exemplary embodiment may differ from the anti-reflective films 100, 100a, and 100b of FIGS. 1 to 3 in that high hardness coating layers 120-1 and 120-2 are formed on both, e.g., opposite, surfaces of the transparent substrate 110. For example, in the anti-reflective film 100c according to the present exemplary embodiment, the high hardness coating layers 120-1 and 120-2 may include a first high hardness coating layer 120-1 on an upper surface of the transparent substrate 110 and a second high hardness coating layer 120-2 on a lower surface thereof. A shape and a material of each of the first and second high hardness coating layers 120-1 and 120-2 may be substantially the same as those described in the high hardness coating layer 120 of the anti-reflective film 100 of FIG. 1.

A shape and a pitch of a first moth-eye pattern ME1 in the first high hardness coating layer 120-1 may be substantially the same as a shape and a pitch of a second moth-eye pattern ME2 in the second high hardness coating layer 120-2. For example, a height and a pitch of a convex portion A1 constituting the first moth-eye pattern ME1 may be substantially the same as a height and a pitch of a convex portion A2 constituting the second moth-eye pattern ME2. A position of the convex portion A1 in the first moth-eye pattern ME1 may be different from a position of the convex portion A2 in the second moth-eye pattern ME2. That is, as illustrated in FIG. 4A, the convex portion A2 of the second moth-eye pattern ME2 may be disposed at a position corresponding to a concave portion B1 of the first moth-eye pattern ME1, e.g., the convex portions A1 and A2 may be offset from each other along a horizontal direction. In addition, as the convex portions A1 and the convex portions A2 are disposed at the same pitch, the convex portion A1 of the first moth-eye pattern ME1 may be disposed at a position corresponding to a concave portion B2 of the second moth-eye pattern ME2.

As the first and second high hardness coating layers 120-1 and 120-2 are disposed on the upper and lower surfaces of the transparent substrate 110, a reflectance of the anti-reflective film 100c may decrease and a transmittance thereof may increase. When the second high hardness coating layer 120-2 does not exist, light entering the first high hardness coating layer 120-1 may be reflected from the lower surface of the transparent substrate 110. However, since the second high hardness coating layer 120-2 is disposed on the lower surface of the transparent substrate 110, light may be prevented from being reflected from the lower surface of the transparent substrate 110, thereby further improving the reflectance and the transmittance of the whole anti-reflective film 100c.

Referring to FIG. 4B, the anti-reflective film 100c' according to the present exemplary embodiment may be similar to the anti-reflective film 100c of FIG. 4A, with the exception of a position relation between the first moth-eye pattern ME1 and a second moth-eye pattern ME2' of the first and second high hardness coating layers 120-1 and 120a-2 being different from a position relation between the first moth-eye pattern ME1 and the second moth-eye pattern ME2 of FIG. 4A. For example, in the anti-reflective film 100c' according to the present exemplary embodiment, a height and a pitch of the first moth-eye pattern ME1 may be substantially the same as a height and a pitch of the second moth-eye pattern ME2', and a position of a convex portion A1 in the first moth-eye pattern ME1 may also be substantially the same as a position of a convex portion A2' in second moth-eye pattern ME2', e.g., the first and second convex portions A1 and S2 may completely overlap each other. As the convex portions A1 and A2' are disposed at the same pitch, a position of the concave portion B1 in the first moth-eye pattern ME1 may also be substantially the same as a position of a concave portion B2' in the second moth-eye pattern ME2'.

Referring to FIG. 4C, first and second moth-eye patterns ME1 and ME2" of the anti-reflective film 100c" according to the present exemplary embodiment may differ from the first and second moth-eye patterns ME1 and ME2 of FIG. 4A in terms of a size, a pitch, or the like. In detail, in the anti-reflective film 100c" according to the present exemplary embodiment, the size of the convex portion A1 of the first moth-eye pattern ME1 in the first high hardness coating layer 120-1 may be different from a size of a convex portion A2" of the second moth-eye pattern ME2" in a second high hardness coating layer 120b-2. For example, the convex portion A1 of the first moth-eye pattern ME1 may have a first width W1 and a first height H1, and the convex portion A2" of the second moth-eye pattern ME2" may have a second width W2 and a third height H3. The second width W2 may be greater than the first width W1, and the third height H3 may be greater than the first height H1.

In addition, a pitch of the first moth-eye pattern ME1 may be different from a pitch of the second moth-eye pattern ME2". For example, the convex portions A1 of the first moth-eye pattern ME1 may be disposed at a first pitch P1, and the convex portions A2 of the second moth-eye pattern ME2" may be disposed at a third pitch P3. The third pitch P3 may be greater than the first pitch P1.

Since the pitch of the first moth-eye pattern ME1 is different from the pitch of the second moth-eye pattern ME2", a relative position between the convex portions A1 and A2" may be continuously changed. Therefore, a position relation between the convex portion A1 and the convex portion A2" may be variously changed by changing a pitch difference between the first moth-eye pattern ME1 and the second moth-eye pattern ME2" and changing a size difference between the convex portion A1 and the convex portion A2".

In the anti-reflective films 100c, 100c', and 100c" of FIGS. 4A to 4C, examples of the structure, which includes the convex portion with the cone shape as in the high hardness coating layer 120 of FIG. 1, have been described as the moth-eye structures of the high hardness coating layers on the both surfaces of the transparent substrate 110. However, in the anti-reflective films 100c, 100c', and 100c" according to the present exemplary embodiments, the moth-eye pattern structures of the high hardness coating layers are not limited to the structure including the convex portion with the cone shape. For example, the moth-eye patterns of the high hardness coating layers may include the convex portion with the dome shape as in the high hardness coating layer 120b of FIG. 3. In addition, in the anti-reflective films 100c, 100c', and 100c" according to the present exemplary embodiments, the moth-eye patterns of the high hardness coating layers may include the concave portion as in the high hardness coating layer 120a of FIG. 2.

Furthermore, in the anti-reflective films 100c, 100c', and 100c" according to the present exemplary embodiments, the moth-eye patterns of the high hardness coating layers on both surfaces of the transparent substrate 110 may have respectively convex portions that have different structures. For example, the moth-eye pattern of the high hardness coating layer on the upper surface of the transparent substrate 110 may include the convex portion with the cone shape as in the high hardness coating layer 120 of FIG. 1, and the moth-eye pattern of the high hardness coating layer on the lower surface of the transparent substrate 110 may include the convex portion with the dome shape as in the high hardness coating layer 120b of FIG. 3.

Figure 5:
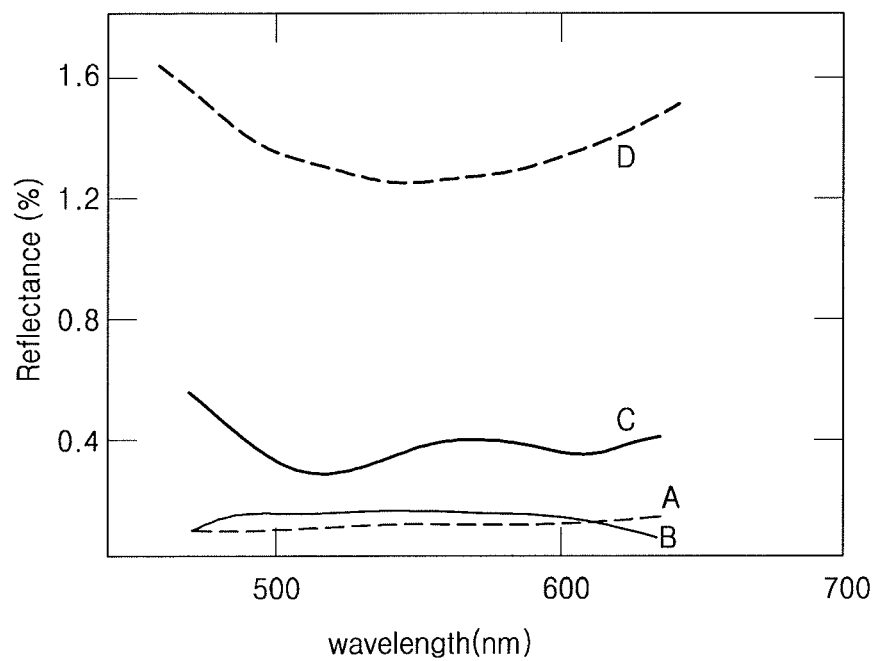
FIG. 5 illustrates a graph showing a reflectance according to a wavelength with respect to an anti-reflective film with a moth-eye structure and different types of anti-reflective films.
Figure 6:
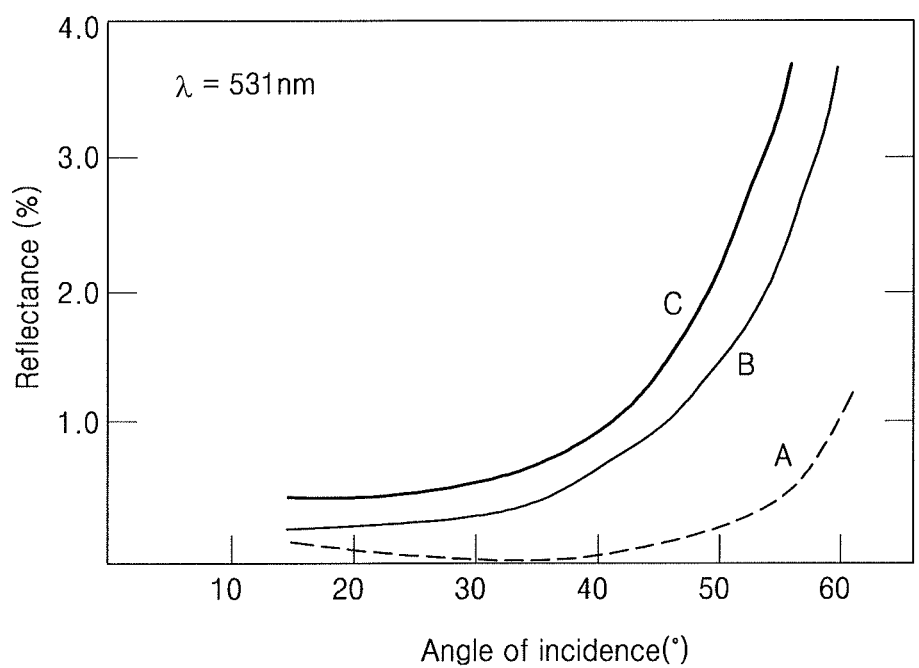
FIG. 6 illustrates a graph showing a reflectance according to an angle of incidence with respect to an anti-reflective film with a moth-eye structure and different types of anti-reflective films.

FIG. 5 is a graph showing reflectance according to a wavelength with respect to an anti-reflective film with a moth-eye structure and different types of anti-reflective films. FIG. 6 is a graph showing reflectance according to an angle of incidence with respect to the anti-reflective film with the moth-eye structure and the different types of anti-reflective films.

In FIGS. 5-6, the symbol "A" indicates a case of the anti-reflective film with the moth-eye pattern structure according to example embodiments, the symbol "B" indicates a case of an anti-reflective film with a multi-layered structure, the symbol "C" indicates a case of an anti-reflective film of a graded index glass, and the symbol "D" indicates a case of an anti-reflective film with a single layer including $MgF_2$. In FIG. 6, a wavelength of light used in a test is about 531 nm, and the angle of incidence may be defined as an angle between light incident on a surface of the anti-reflective film and a line perpendicular to the surface.

Referring to FIG. 5, it may be seen that in the case of D, reflectance is high as a whole. Further, in the case of C, reflectance is relatively low in the wavelength range of about 500 nm to about 600 nm, but the fluctuation in the reflectance is large according to the wavelength. For reference, the graded index glass may mean glass in which a refractive index is continuously changed as in a slope shape. In the cases of A and B, it may be seen that low reflectance is maintained in a broad region including the wavelength range of about 500 nm to about 600 nm, i.e., a broadband. In particular, in the case of A, it may be confirmed that the reflectance is almost unchanged according to the wavelength.

Due to the result, it may be seen that the anti-reflective films of A and B are effective to some degree with respect to an antireflection. It is noted, however, that since the anti-reflective film of B is manufactured by coating several sheets having different refractive indexes, the manufacturing process is more complex, and requires longer time and higher costs. Further, as can be confirmed in FIG. 6, in the anti-reflective film of B, a change in reflectance is excessively large according to an angle of incidence.

In contrast, in the case of the anti-reflective film A according to exemplary embodiments, the anti-reflective film A exhibits effectiveness with respect to an antireflection, as well as simplified manufacturing processes due to a single-layered film structure. That is, the anti-reflective film A includes a fine moth-eye pattern, e.g., having several hundreds of nano-sizes protrusions on a surface thereof, and a predetermined degree of high surface hardness. In detail, since the anti-reflective film according to the present exemplary embodiment has a hardness of 4H or more as described above, the anti-reflective film may satisfy a requirement for the high surface hardness. In addition, as will be described in the methods for manufacturing an anti-reflective film in FIGS. 29A to 37 below, in the anti-reflective film according to the present exemplary embodiments, the fine moth-eye pattern may be relatively easily formed through am imprinting process.

Referring to FIG. 6, in the cases of B and C, it may be seen that when the angle of incidence is 30° or more, a reflectance abruptly increases. In the case of A, it may be seen that the reflectance is low and is constantly maintained up to an angle of incidence of about 45°. In addition, it may be considered that the case of A maintains a low reflectance up to an angle of incidence of approximately 55° compared to a reflectance in a section showing a low reflectance of B and C.

The results show that the anti-reflective film of A according to example embodiments exhibits an excellent antireflection function with respect to a certain degree of angle of incidence as well as a normal incidence.

Figure 7A:
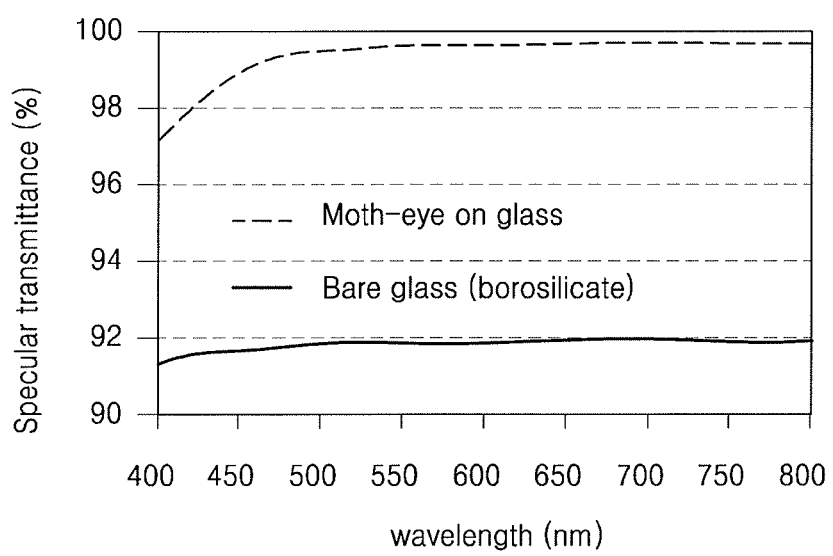
FIGS. 7A and 7B illustrate graphs showing transmittance and reflectance according to a wavelength in cases including and not including the anti-reflective film according to an exemplary embodiment.
Figure 7B:
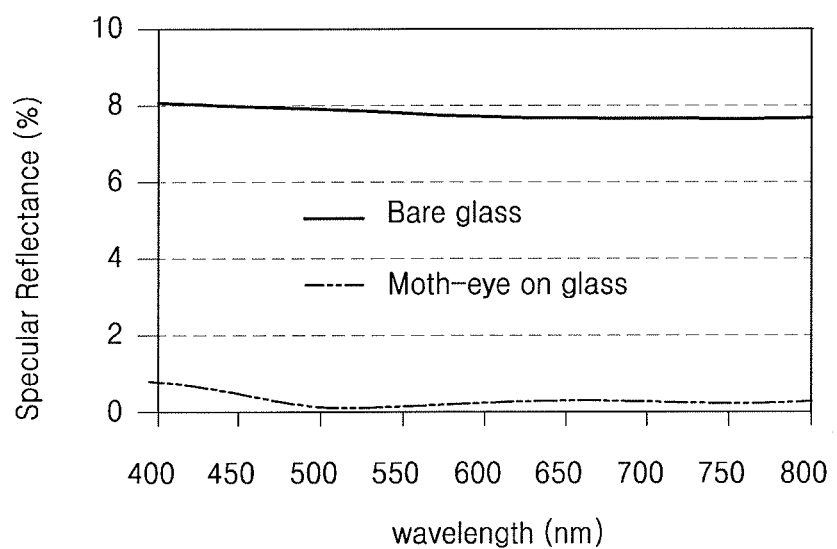

FIGS. 7A and 7B are graphs showing transmittance and reflectance according to a wavelength in cases of including and not including the anti-reflective film according to an exemplary embodiment. A dotted line (FIG. 7A) and a dashed line (FIG. 7B) indicate a case of glass that includes the anti-reflective film with a moth-eye pattern according to example embodiments, and solid lines (FIGS. 7A and 7B) indicate bare glass that does not include the anti-reflective film. The glass may be, e.g., borosilicate glass.

Referring to FIG. 7A, it may be confirmed that the bare glass exhibits transmittance of about 92% or less with respect to all of wavelengths, and the glass including the anti-reflective film with the moth-eye pattern exhibits transmittance of about 99% or more with respect to a wavelength of about 450 nm or more.

More specifically, the test result of FIG. 7A indicates a case in which the anti-reflective films are disposed on both surfaces of glass, and show transmittance of about 99.7% with respect to a visible ray region. Although not illustrated, when the anti-reflective film is disposed on a single surface of glass, it has been reported that the transmittance is about 95.8%.

For reference, when light transmits through a medium, specular transmission and dispersion transmission or diffuse transmission occur. The specular transmission is referred to as regular transmission and means a phenomenon in which a propagation direction of light is changed due to a reflectance difference between two mediums when light transmits between the two mediums. The dispersion transmission means a phenomenon in which light is dispersed in various directions due to characteristics of a molecular unit as in irregular reflection of light. A transmittance due to the regular transmission is referred to as a regular transmittance, and a transmittance due to the dispersion transmission is referred to as a dispersion transmittance. The graph of FIG. 7A shows results obtained by measuring only the regular transmittance except the dispersion transmittance.

In addition, similarly as a concept of the transmission, when light is reflected from a medium, specular reflection and diffuse reflection occur. The specular reflection is referred to as regular reflection and means reflection according to the law that "the angle of incidence is equal to the angle of reflection", and the diffuse reflection is a phenomenon in which light is dispersed due to an existence of various angles in terms of a material at the level of a molecule. The diffuse reflection consists of countless specular reflections. Reflectance due to the regular reflection is referred to as a regular reflection, and reflectance due to the diffuse reflection is referred to as diffuse reflectance.

Referring to FIG. 7B, it may be confirmed that the bare glass exhibits a reflectance of about 8% or less with respect to all of wavelengths, and the glass including the anti-reflective film with the moth-eye pattern exhibits a reflectance of less than 1% with respect to a wavelength of about 450 nm or more. The test result of FIG. 7B indicates a case in which the anti-reflective films are disposed on both surfaces of glass, and exhibit transmittance of about 0.3% or less with respect to a visible ray region.

From the results of FIGS. 7A and 7B, it may be estimated that the reflection of light is efficiently prevented by applying the anti-reflective film with the moth-eye pattern according to example embodiments to the cover glass of the electronic device.

Figure 8:
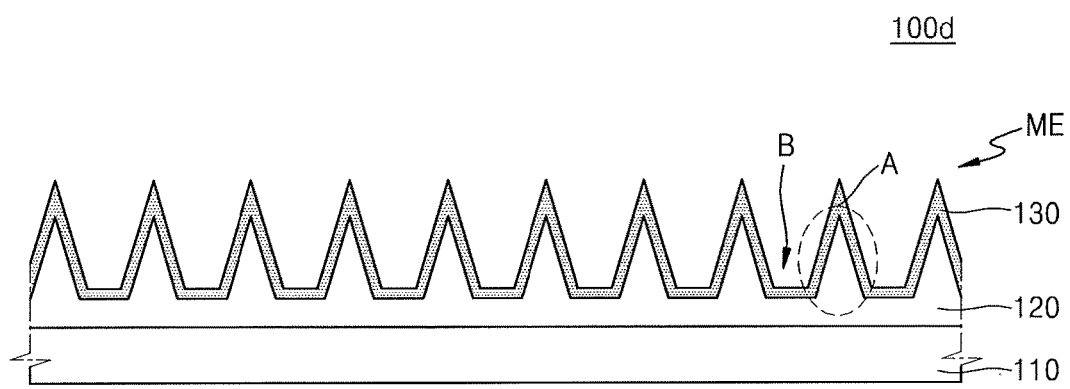
FIGS. 8 and 9 illustrate cross-sectional views of anti-reflective films according to other exemplary embodiments.
Figure 9:
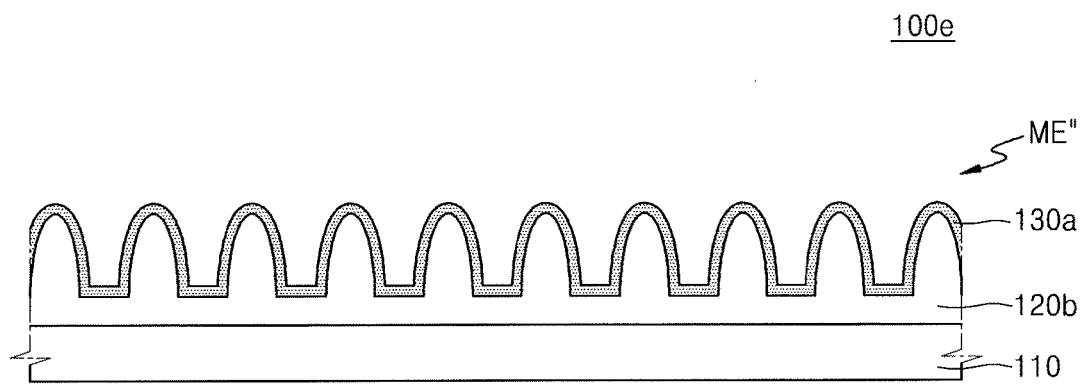

FIGS. 8 and 9 are cross-sectional views of anti-reflective films 100d and 100e according to another exemplary embodiment. The description provided in FIGS. 1 and 3 will be simplified or omitted for convenience in description.

Referring to FIG. 8, the anti-reflective film 100d according to the present exemplary embodiment may differ from the anti-reflective film 100 of FIG. 1 in that the anti-reflective film 100d further includes a first protection layer 130. As illustrated in FIG. 8, the first protection layer 130 may have a structure surrounding the moth-eye pattern ME of the high hardness coating layer 120 and may be formed so as to have a very thin thickness. For example, the first protection layer 130 may be, e.g., conformally, formed on the high hardness coating layer 120, so as to have a thickness of several ten nanometers to several hundred nanometers. As the first protection layer 130 is formed so as to have a very thin thickness, the first protection layer 130 may have a structure so as to correspond to a convex portion A and a concave portion B of the moth-eye pattern ME.

The first protection layer 130 may function to protect the moth-eye pattern ME of the high hardness coating layer 120. In addition, the first protection layer 130 may provide a function as an anti-finger coating layer, a function for improving a surface hardness, or a function for a chemical resistance. For example, the first protection layer 130 may be formed as an anti-finger coating layer including a fluorine-based material or may be formed as a high hardness coating layer such as a diamond like carbon (DLC) coating layer.

The first protection layer 130 may be formed through at least one of an atomic layer deposition (ALD) process, a laser deposition process, a sputtering process, an evaporation process, a spin coating process, a dip coating process, a slot die coating process, and a lamination coating process.

In the anti-reflective film 100d according to the present exemplary embodiment, since the first protection layer 130 comes into contact with air, the first protection layer 130 may include a material that has a low refractive index so as to prevent reflection. In a case where a medium is very thin, even when a refractive index of the medium is slightly high, reflection by the medium may be negligible. As described above, the first protection layer 130 may be formed so as to have a very thin thickness. Therefore, the first protection layer 130 may include a material that has a certain degree of high refractive index, reflection by the first protection layer may be negligible. For example, when the DLC coating layer has a refractive index of about 2.4 but is formed so as to have a very thin thickness, the DLC coating layer may be used as the first protection layer 130.

Referring to FIG. 9, the anti-reflective film 100e according to the present exemplary embodiment may differ from the anti-reflective film 100b of FIG. 3 in that the anti-reflective film 100e further includes a first protection layer 130a. For example, in the anti-reflective film 100e according to the present exemplary embodiment, a moth-eye pattern ME" of a high hardness coating layer 120b may include a convex portion with a dome shape. In addition, the first protection layer 130a on the high hardness coating layer 120b may have a structure that covers the moth-eye ME" pattern disposed thereunder and may have a structure that is uneven, e.g., tracing shapes of convex and concave portions. A thickness, a function, and a material of the first protection layer 130a, and a method of forming the first protection layer 130a may be substantially the same as those described in the anti-reflective film 100d of FIG. 8.

Figure 10:
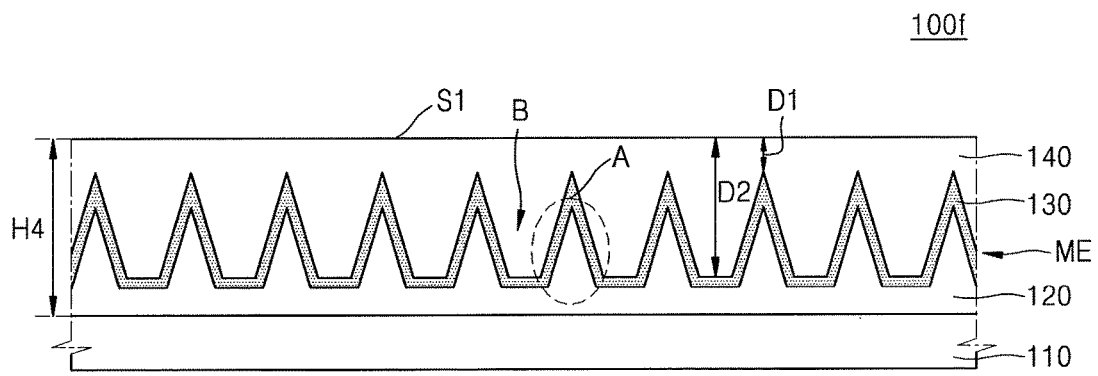
FIGS. 10 to 12 illustrate cross-sectional views of anti-reflective films according to other exemplary embodiments.
Figure 11:
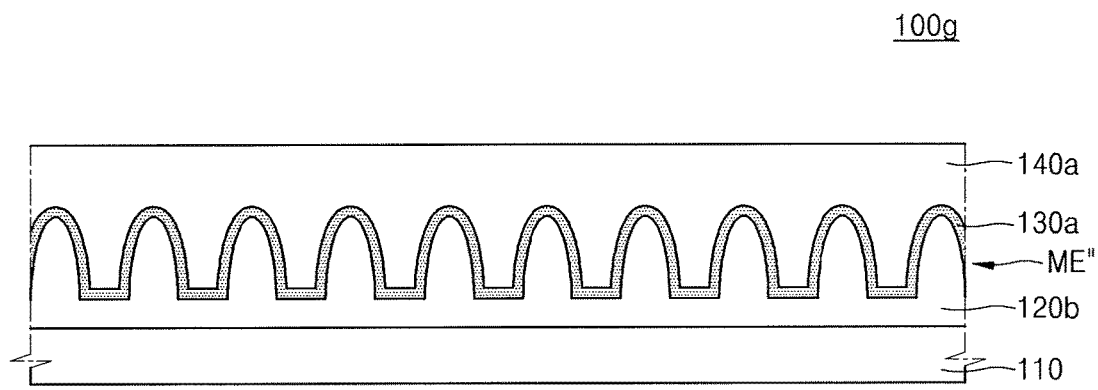
Figure 12:
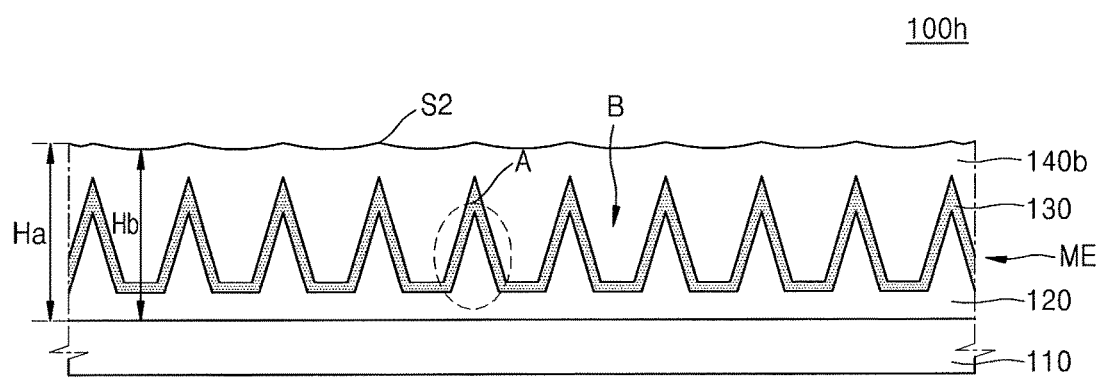

FIGS. 10 to 12 are cross-sectional views of anti-reflective films 100f, 100g, and 100h according to another exemplary embodiment. The description provided in FIGS. 1, 3, 8, and 9 will be simplified or omitted for convenience in description.

Referring to FIG. 10, the anti-reflective film 100f according to the present exemplary embodiment may differ from the anti-reflective film 100d of FIG. 8 in that the anti-reflective film 100f further includes a second protection layer 140. As illustrated in FIG. 10, the second protection layer 140 may be formed so as to have a structure that covers a first protection layer 130. Specifically, the second protection layer 140 may be formed so as to have a structure that covers a convex portion of the first protection layer 130 and fills a concave portion thereof, the convex portion and the concave portion of the first protection layer 130 respectively corresponding to a convex portion A and a concave portion B of a moth-eye pattern ME. In addition, an upper surface S1 of the second protection layer 140 may be flat and smooth. Accordingly, in the second protection layer 140, a first thickness D1 of a portion corresponding to the convex portion A may be less than a second thickness D2 of a portion corresponding to the concave portion B.

As the second protection layer 140 is formed, a fourth height H4 may correspond to a height from an upper surface of the transparent substrate 110 to the upper surface S1 of the second protection layer 140. The first thickness D1 may affect a decrease in reflectance, and in order to maximize the decrease in reflectance, the first thickness D1 may be minimized.

The second protection layer 140 may function to protect the moth-eye pattern ME of the high hardness coating layer 120 and/or the first protection layer 130. In addition, the second protection layer 140 may provide a function as an anti-finger coating layer, a function for improving a surface hardness, or a function for a chemical resistance. Therefore, the second protection layer 140 may be formed as the anti-finger coating layer or as a high hardness coating layer. In some cases, the first protection layer 130 may be omitted. In addition, since the second protection layer 140 is formed such that the upper surface S1 is flat and smooth, when the second protection layer 140 has substantially the same hardness as the first protection layer 130, the second protection layer 140 may provide a greater contribution to a wear resistance compared to the first protection layer 130.

In the anti-reflective film 100f according to the present exemplary embodiment, since the second protection layer 140 comes into contact with air, the second protection layer 140 may include a transparent material that has a low refractive index. In addition, since the second protection layer 140 may be formed so as to have a relatively thick thickness unlike the first protection layer 130, the second protection layer 140 may not be allowed to include a material than has a high refractive index. For example, the second protection layer 140 may include a transparent material that has a low refractive index of less than about 1.45. The second protection layer 140 may be formed through at least one of an atomic layer deposition (ALD) process, a laser deposition process, a chemical vapor deposition (CVD) process, a sputtering process, an evaporation process, a spin coating process, a dip coating process, a slot die coating process, and a lamination coating process.

When the first protection layer 130 includes a material that has a relatively high refractive index, in the anti-reflective film 100f according to the present exemplary embodiment, material layers may be formed on the transparent substrate 110 in a manner of sequentially forming the high hardness coating layer 120 (low refractive index material), the first protection layer 130 (high refractive index material), the second protection layer 140 (low refractive index material), i.e., alternately and repeatedly forming a low refractive index material and a high refractive index material. In this case, characteristics of a multi-layered anti-reflective film are added to the anti-reflective film 100f according to the present exemplary embodiment, thereby further improving antireflection characteristics.

Referring to FIG. 11, the anti-reflective film 100g according to the present exemplary embodiment may differ from the anti-reflective film 100e of FIG. 9 in that the anti-reflective film 100g further includes a second protection layer 140a. For example, in the anti-reflective film 100g according to the present exemplary embodiment, the moth-eye pattern ME" of the high hardness coating layer 120b may include a convex portion with a dome shape, and a first protection layer 130a may have a structure that covers the moth-eye pattern ME" and is uneven according to the convex portion (A' of FIG. 3) and the concave portion (B" of FIG. 3). In addition, the second protection layer 140a may be formed so as to have a structure that covers a convex portion of the first protection layer 130a and fills a concave portion thereof, the convex portion and the concave portion of the first protection layer 130a respectively corresponding to the convex portion A' and the concave portion B" of the moth-eye pattern ME".

An upper surface of the second protection layer 140a may be flat and smooth like the upper surface S1 of the second protection layer 140 of the anti-reflective film 100f of FIG. 10. A thickness, a function, and a material of the second protection layer 140a and a method of forming the second protection layer 140a may be substantially the same as those described in the anti-reflective film 100f of FIG. 10.

Referring to FIG. 12, the anti-reflective film 100h according to the present exemplary embodiment may differ from the anti-reflective film 100f of FIG. 10 in that an upper surface S2 of a second protection layer 140b is uneven. In detail, in the anti-reflective film 100h according to the present exemplary embodiment, the upper surface S2 of the second protection layer 140b may have a structure in which a portion corresponding to the convex portion A of the moth-eye pattern ME slightly protrudes upward from the surface S2, and a portion corresponding to the concave portion B thereof is dented. Accordingly, in the second protection layer 140b, a height Ha of the portion corresponding to the convex portion A may be greater than a height Hb of the portion corresponding to the concave portion B.

The above-described structure of the second protection layer 140b may be implemented through a film lamination process. For example, the structure of the second protection layer 140b may be obtained by preparing a protection layer material in a film shape, overlapping the protection layer material with the film shape on the first protection layer 130, and heating and/or pressurizing the resultant structure. A thickness, a function, and a material of the second protection layer 140b may be substantially the same as those described in the anti-reflective film 100f of FIG. 10.

Figure 13:
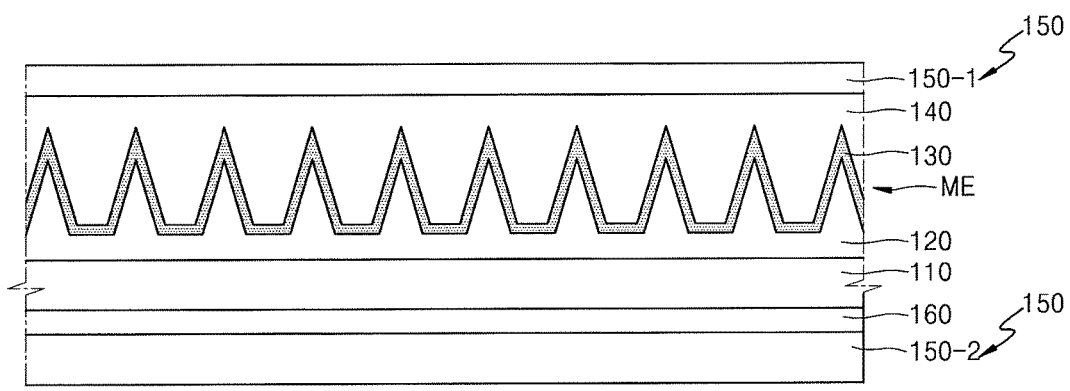
FIGS. 13 and 14 illustrate cross-sectional views of anti-reflective films according to other exemplary embodiments.
Figure 14:
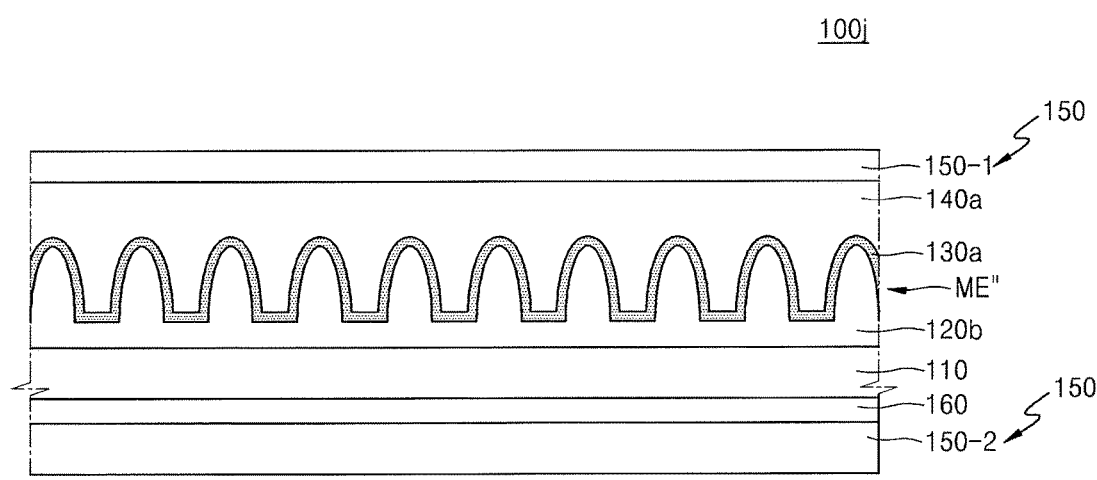

FIGS. 13 and 14 are cross-sectional views of anti-reflective films 100i and 100j according to another exemplary embodiment. The description provided in FIGS. 1, 3, and 8 to 11 will be simplified or omitted for convenience in description.

Referring to FIG. 13, the anti-reflective film 100i according to the present exemplary embodiment may differ from the anti-reflective film 100f of FIG. 10 in that the anti-reflective film 100i further includes third protection layers 150 and an adhesion layer 160, and has a configuration of a single type. For example, when a cover glass already exists in an electronic device, e.g., a camera device or a display device, the anti-reflective film 100i according to the present exemplary embodiment may have a configuration of a single product type that is used as being attached to the cover glass.

In detail, the third protection layer 150 may include a third upper protection layer 150-1 disposed on the second protection layer 140 and a third lower protection layer 150-2 disposed under the adhesion layer 160. The third upper and lower protection layers 150-1 and 150-2 may be layers that may be separated and removed. Each of the third upper and lower protection layers 150-1 and 150-2 may include an ethyl vinyl acetate (EVA) film. Of course, a material of each of the third upper and lower protection layers 150-1 and 150-2 is not limited to the ethyl vinyl acetate (EVA) film.

According to the present exemplary embodiment, before the anti-reflective film 100i is used as being attached to other products such as the cover glass of the electronic device, the third upper and lower protection layers 150-1 and 150-2 may protect a body portion of the anti-reflective film 100i by preventing the second protection layer 140 and the adhesion layer 160 from being exposed to the outside to protect. The body portion may include, for example, the transparent substrate 110, the high hardness coating layer 120, the first protection layer 130, and the second protection layer 140, and the adhesion layer 160. When the anti-reflective film 100i according to the present exemplary embodiment is used in other products, the third upper and lower protection layers 150-1 and 150-2 may be separated and removed from the body portion.

The adhesion layer 160 may be disposed on a lower surface of the transparent substrate 110, and the third lower protection layer 150-2 may be disposed under the adhesion layer 160. When the anti-reflective film 100i is used in other products such as the cover glass of the electronic device, after the third upper and lower protection layers 150-1 and 150-2 are removed, the adhesion layer 160 may be a layer that is attached and coupled to the other products. The adhesion layer 160 may include a transparent material that has a high transmission property. For example, the adhesion layer 160 may include at least one of an optically clear adhesive (OCA) film, an acrylic low viscosity adhesive, and a thermoplastic polyurethane (TPU) adhesive film. However, the material of the adhesion layer 160 is not limited to the above. In addition, the adhesion layer 160 may be formed so as to have, for example, a very thin thickness of 0.05 mm or less. However, a thickness of the adhesion layer 160 is not limited to the numerical value.

Referring to FIG. 14, the anti-reflective film 100j according to the present exemplary embodiment may differ from the anti-reflective film 100g of FIG. 11 in that the anti-reflective film 100j further includes the adhesion layer 160 and the third protection layers 150 including the third upper and lower protection layers 150-1 and 150-2 and has a configuration of a single type. For example, in the anti-reflective film 100j according to the present exemplary embodiment, the moth-eye pattern ME" of the high hardness coating layer 120b may include a convex portion with a dome shape, the first protection layer 130a may have a structure that covers the moth-eye pattern ME" and is uneven according to the convex portion and a concave portion of the moth-eye pattern ME", and the second protection layer 140a may cover the first protection layer 130a and may have a structure in which an upper surface thereof is flat and smooth.

In addition, as described in the anti-reflective film 100i of FIG. 13, the anti-reflective film 100j according to the present exemplary embodiment may include the adhesion layer 160 disposed on the lower surface of a transparent substrate 110 and the third upper and lower protection layers 150-1 and 150-2 respectively disposed on the second protection layer 140a and under the adhesion layer 160. A thickness and a function of each of the third upper and lower protection layers 150-1 and 150-2 and a function, a material, and a thickness of the adhesion layer 160 may be substantially the same as those described in the anti-reflective film 100i of FIG. 13.

Figure 15:
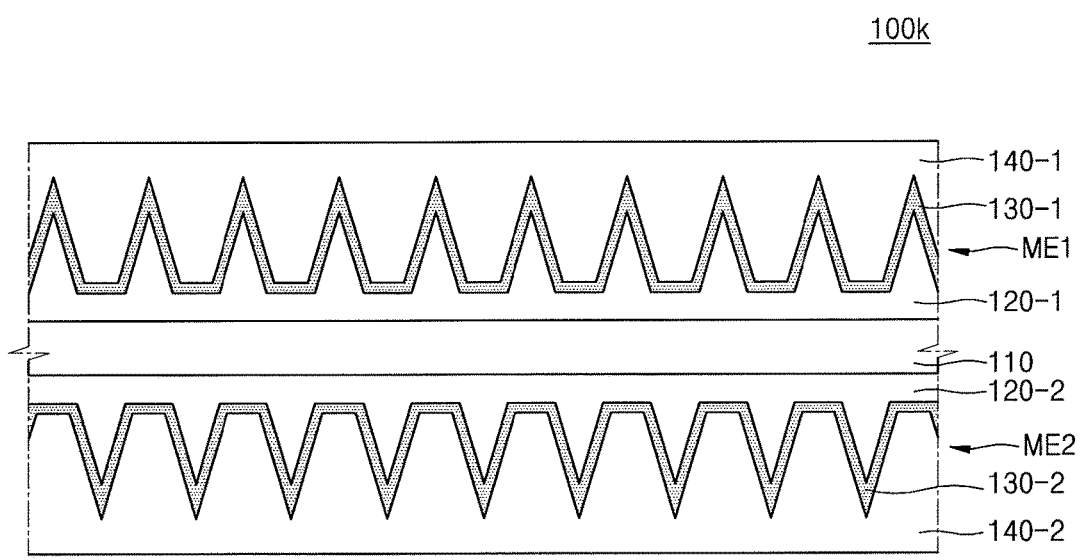
FIGS. 15 to 17 illustrate cross-sectional views of anti-reflective films according to other exemplary embodiments.
Figure 16:
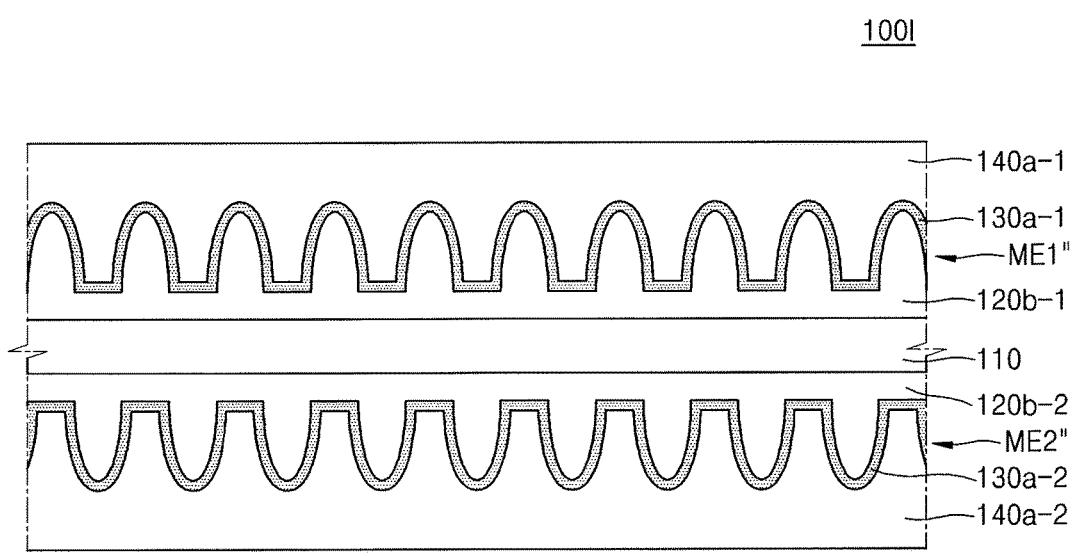
Figure 17:
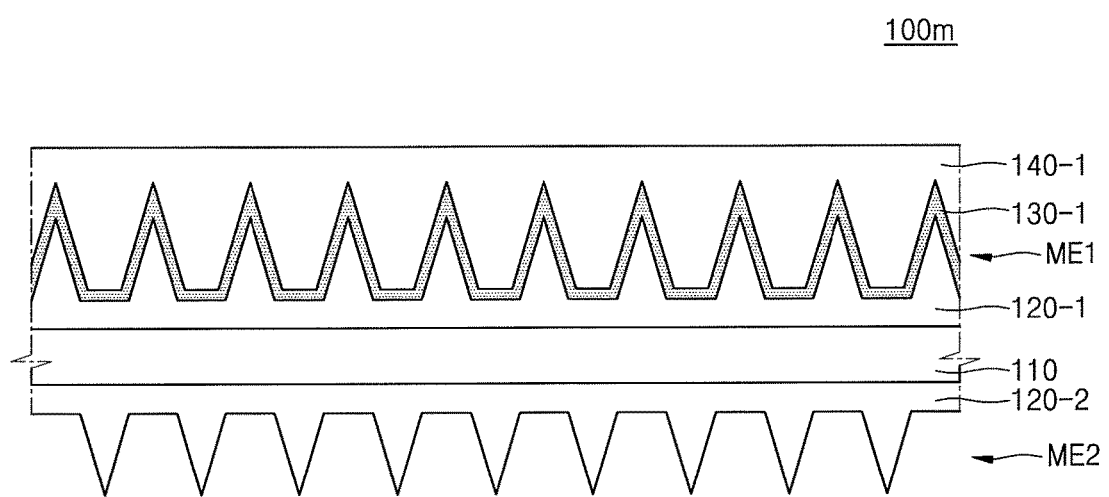

FIGS. 15 to 17 are cross-sectional views of anti-reflective films 100k, 100l, 100m according to another exemplary embodiment. The description provided in FIGS. 1, 3, 4a to 4c, and 8 to 11 will be simplified or omitted for convenience in description.

Referring to FIG. 15, the anti-reflective film 100k according to the present exemplary embodiment may differ from the anti-reflective film 100f of FIG. 10 in that the anti-reflective film 100k includes high hardness coating layers 120-1 and 120-2 on both surfaces of the transparent substrate 110, first upper and lower protection layers 130-1 and 130-2, and second upper and lower protection layers 140-1 and 140-2. For example, in the anti-reflective film 100k according to the present exemplary embodiment may be similar to the anti-reflective film 100c of FIG. 4A in that the high hardness coating layers 120-1 and 120-2 are disposed on both surfaces of the transparent substrate 110. The high hardness coating layers 120-1 and 120-2 may include a first high hardness coating layer 120-1 on an upper surface of the transparent substrate 110, and a second high hardness coating layer 120-2 on a lower surface thereof.

In the anti-reflective film 100k according to the present exemplary embodiment, structures of the first and second high hardness coating layers 120-1 and 120-2 are not limited to the structures of the first and second high hardness coating layers 120-1 and 120-2 of FIG. 4A. For example, the structures of the high hardness coating layers in the anti-reflective films 100c' and 100c" of FIGS. 4B and 4C may be applied to the ant-reflective film 100k according to the present exemplary embodiment.

As illustrated in FIG. 15, the first and second upper protection layers 130-1 and 140-1 may be disposed on the first high hardness coating layer 120-1, and the first and second lower protection layers 130-2 and 140-2 may be disposed under the second high hardness coating layer 120-2. As described above, when the structures of the high hardness coating layers in the anti-reflective films 100c' and 100c" of FIGS. 4B and 4C are applied to the anti-reflective film 100k according to the present exemplary embodiment, a relative position may be slightly changed between the first lower protection layer 130-2 and the second lower protection layer 140-2.

As in the anti-reflective film 100k according to the present exemplary embodiment, when the first and second high hardness coating layers 120-1 and 120-2 are disposed on both surfaces of the transparent substrate 110, an increase in transmittance and a decrease in reflectance are substantially the same as those described in the anti-reflective film 100c of FIG. 4A and described with reference to the graphs of FIGS. 7A and 7B. A structure, a material, and a function of each of the first upper and lower protection layers 130-1 and 130-2 and the second upper and lower protection layers 140-1 and 140-2 and a method of forming each thereof may be substantially the same as those described in the anti-reflective films 100d and 100f of FIGS. 8 and 10.

Referring to FIG. 16, the anti-reflective film 100l according to the present exemplary embodiment may differ from the anti-reflective film 100k of FIG. 15 in terms of structures of high hardness coating layers 120b-1 and 120b-2 disposed on upper and lower surfaces of the transparent substrate 110 and structures of upper layers according to the structures of the high hardness coating layers 120b-1 and 120b-2.

For example, in the anti-reflective film 100l according to the present exemplary embodiment, each of moth-eye patterns ME1" and ME2" in the high hardness coating layers 120b-1 and 120b-2 may include a convex portion with a dome shape like the moth-eye pattern ME" of the high hardness coating layer 120b in the anti-reflective film 100b of FIG. 3. In addition, first and second protection layers 130a-1 and 130a-2 may respectively cover the moth-eye patterns ME1" and ME2" corresponding thereto, and each of the first and second protection layers 130a-1 and 130a-2 may have a structure that is uneven according to the convex portion and a concave portion of each of the moth-eye patterns ME1" and ME2". Second protection layers 140a-1 and 140a-2 may respectively cover the first protection layers 130a-1 and 130a-2 corresponding thereto, and each of the second protection layers 140a-1 and 140a-2 may have a structure in which an upper surface thereof is flat and smooth. The other descriptions may be substantially the same as those provided in the anti-reflective film 100k of FIG. 15 and previously described in the anti-reflective films according to the exemplary embodiments.

Referring to FIG. 17, the anti-reflective film 100m according to the present exemplary embodiment may differ from the anti-reflective film 100k of FIG. 15 in terms of structures of material layers disposed on a lower surface of the transparent substrate 110. In detail, in the anti-reflective film 100m according to the present exemplary embodiment, only a second high hardness coating layer 120-2 may be disposed on the lower surface of the transparent substrate 110, and a first lower protection layer or a second lower protection layer may not be disposed under the second high hardness coating layer 120-2.

In the anti-reflective film 100m according to the present exemplary embodiment, the forming of only the second high hardness coating layer 120-2 on the lower surface of the transparent substrate 110 is because when the anti-reflective film 100m according to the present exemplary embodiment is used as a transparent cover layer of a camera device or a display device or is used as being attached to the transparent cover layer, there is little chance that a physical impact such as a touch or a scratch is applied to the lower surface of the transparent substrate 110, which faces an inside of the camera device or the display device.

According to the present exemplary embodiment, the anti-reflective film 100m may have a structure in which the first and second lower protection layers are omitted, based on the anti-reflective film 100k of FIG. 15 but is not limited thereto. The anti-reflective film 100m may have a structure in which the first and second lower protection layers are omitted, based on the anti-reflective film 100l of FIG. 16. As described in the anti-reflective films 100c, 100c', and 100c" of FIGS. 4A to 4C, a size or a pitch of a convex portion constituting a moth-eye pattern ME1 in a first high hardness coating layer 120-1 on an upper surface of the transparent substrate 110 may be substantially the same as or may be different from a shape or a pitch of a convex portion of a moth-eye pattern ME2 in the second high hardness coating layer 120-2 on the lower surface of the transparent substrate 110. In addition, when the size and the pitch of the convex portion in the first high hardness coating layer 120-1 is substantially the same as the size and the pitch of the convex portion in the second high hardness coating layer 120-2, a relative position may be different between the convex portion of the first high hardness coating layer 120-1 and the convex portion of the second high hardness coating layer 120-2. Furthermore, the structure of the moth-eye pattern ME1 in the first high hardness coating layer 120-1 may be quite different from the structure of the moth-eye pattern ME2 in the second high hardness coating layer 120-2.

The anti-reflective films 100k, 100l, and 100m of FIGS. 15 to 17 may have a structure of a single type like the anti-reflective film 100i or 100j of FIG. 13 or 14. As described above, when the anti-reflective films 100k, 100l, and 100m have structure of the single type, a third upper protection layer may be disposed on each of the second upper protection layers 140-1 and 140a-1, an adhesion layer may be disposed under each of the second lower protection layers 140-2 and 140a-2 or under the second high hardness coating layer 120-2, and a third lower protection layer may be disposed under the adhesion layer.

Figure 18:
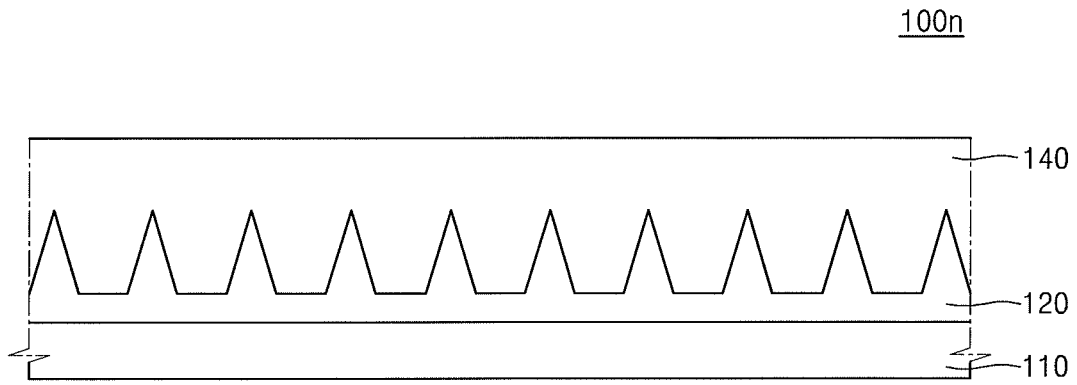
FIGS. 18 to 20 illustrate cross-sectional views of anti-reflective films according to other exemplary embodiments.
Figure 19:
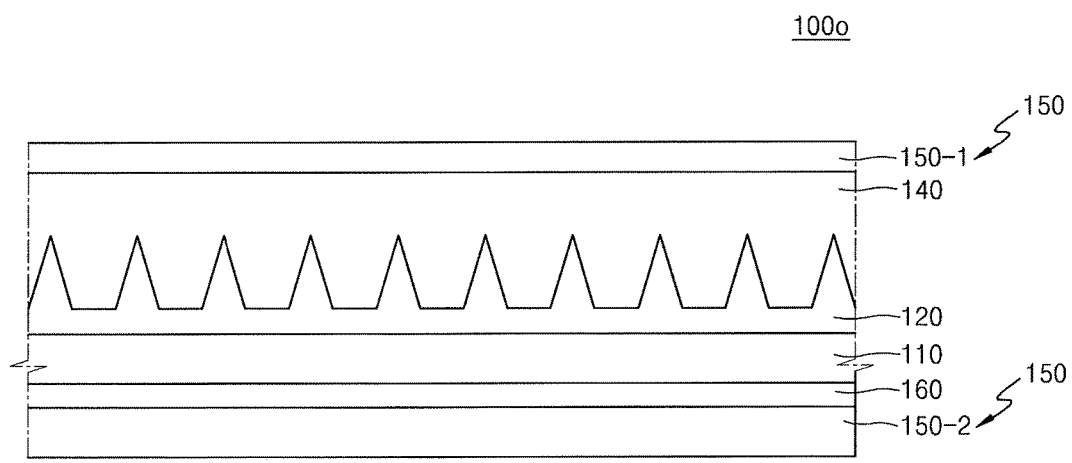
Figure 20:
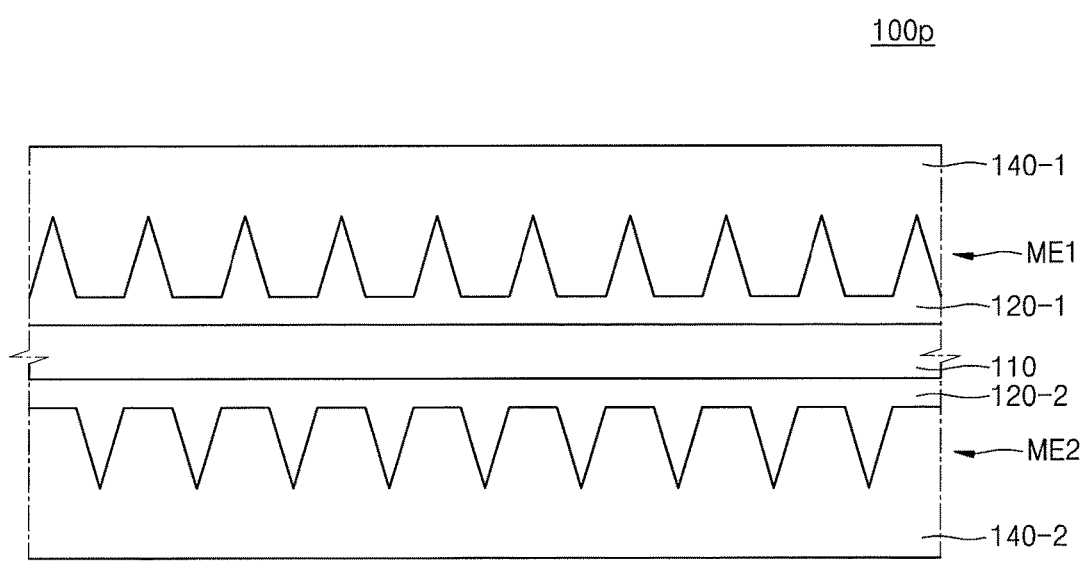

FIGS. 18 to 20 are cross-sectional views of anti-reflective films 100n, 100o, 100p according to another exemplary embodiment. The description provided in FIGS. 1, 10, 13, and 15 will be simplified or omitted for convenience in description.

Referring to FIGS. 18 to 20, the anti-reflective film 100n of FIG. 18 may differ from the anti-reflective film 100f of FIG. 10 in that a first protection layer is omitted. In addition, the anti-reflective film 100o of FIG. 19 may differ from the anti-reflective film 100i of FIG. 13 in that a first protection layer is omitted. Furthermore, the anti-reflective film 100p of FIG. 20 may differ from the anti-reflective film 100k of FIG. 15 in that a first protection layer is omitted. As described above, when each of second protection layers 140, 140-1, and 140-2 has a relatively low refractive index and is able to perform a function as an anti-finger coating layer or a wear resistance function, the first protection layer may be omitted.

The anti-reflective films 100n, 100o, 100p according to the present exemplary embodiments may have a structure in which the first protection layer is omitted from each of the anti-reflective films 100f, 100i, and 100k of FIGS. 10, 13, and 15, but structures of the anti-reflective films 100n, 100o, 100p are not limited thereto. For example, the anti-reflective films 100n, 100o, and 100p according to the present exemplary embodiments may have a structure in which the first protection layer is omitted from each of the anti-reflective films 100g, 100h, 100j, 100l, and 100m of FIGS. 11, 12, 14, 16, and 17.

In addition, as in the anti-reflective films 100i and 100j of FIGS. 13 and 14, the anti-reflective film 100p of FIG. 20 or the anti-reflective films having the structure in which the first protection layer is omitted from each of the anti-reflective films 100g, 100h, 100j, 100l, and 100m of FIGS. 11, 12, 14, 16, and 17 may also have a structure of a single type by disposing an adhesion layer on a lower surface of a transparent substrate 110 or on an outermost material layer disposed on the lower surface of the transparent substrate 110, and disposing a third protection layer on each of a lower surface of the adhesion layer and a surface layer which is opposed to the adhesion layer.

Figure 21:
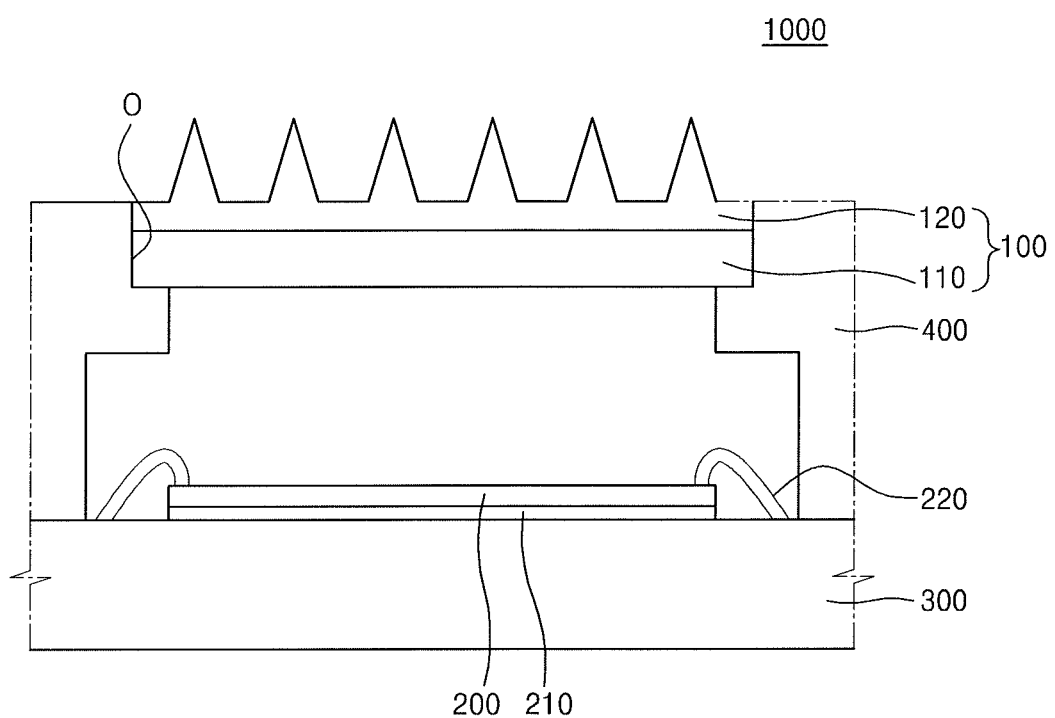
FIG. 21 illustrates a cross-sectional view of an electronic device including the anti-reflective film of FIG. 1, according to an exemplary embodiment.

FIG. 21 is a cross-sectional view of an electronic device 1000 including the anti-reflective film 100 of FIG. 1, according to an exemplary embodiment. The description provided in FIG. 1 will be simplified or omitted for convenience in description.

Referring to FIG. 21, the electronic device 1000 according to the present exemplary embodiment may include the anti-reflective film 100, a semiconductor chip 200, a printed circuit board (PCB) 300, and a holder 400. The electronic device 1000 may be, e.g., a camera device that includes a CMOS image sensor (CIS) or a charge coupled device (CCD).

The semiconductor chip 200 may be a semiconductor chip for the CIS or the CCD, which includes a plurality of photodiodes and a plurality of integrated circuits. Only one semiconductor chip 200 is illustrated in FIG. 21, but two or more semiconductor chips 200 may be stacked on the PCB 300. The two or more semiconductor chips 200 may include a memory chip and/or a non-memory chip. The non-memory chip may include a logic device such as a CPU or a microprocessor. The memory chip may include various types of memory devices, e.g., a dynamic random access memory (DRAM), a static random access memory (SRAM), a flash memory, a parameter random access memory (PRAM), a resistive random access memory (ReRAM), a ferroelectric random access memory (FeRAM), or a magneto-resistive random access memory (MRAM).

The semiconductor chip 200 may be stacked on the PCB 300 through an adhesion layer 210 and may be electrically connected to the PCB 300 by a wire 220 through a wire bonding process. The semiconductor chip 200 is not limited to the wire bonding process and may be stacked on the PCB through a flip-chip bonding process.

The PCB 300 may be a substrate that the semiconductor chip 200 is mounted on, and may include, e.g., a body layer and upper and lower protection layers. A multi-layered or a single-layered wiring pattern may be formed in the body layer, and an external connection member and a substrate pad may be electrically connected through the wiring pattern. Since a chip pad of the semiconductor chip mounted on the PCB 300 is connected to the substrate pad through the wire 220, integrated devices in the semiconductor chip 200 may be electrically connected to the PCB 300. Connecting the chip pad to the substrate pad is not limited to the wire 220, and the chip pad may be connected to the substrate pad by using bumps as in flip-chip bonding, or TSVs. The lower and upper protection layers may function to protect the body layer and may include, e.g., a solder resist (SR).

The holder 400 may be disposed on the PCB 300 so as to surround the semiconductor chip 200. The holder 400 may be coupled to the PCB 300 and the anti-reflective film 100 to protect the semiconductor chip 200 so as not to be exposed to the outside. The holder 400 may be formed so as to constitute an external appearance of the electronic device 1000, e.g., the camera device, and an open region O may be formed in an upper portion of the holder 400. The anti-reflective film 100 may be disposed in the open region O to seal the semiconductor chip 200 from the outside.

Although not illustrated, in order to shield an electromagnetic-wave, a separate shield may be added so as to cover an external surface of the holder, or a conductive film may be applied. In addition, the electronic device 1000 is simplified in FIG. 21 for convenience in description, but other configurations, e.g., a lens barrel including at least one lens or an actuator for automatic focusing and/or a camera shake correction, may be further implemented inside the holder 400.

As described above, the anti-reflective film 100 may be disposed in the open region O of the holder 400 to constitute an outermost transparent cover layer of the electronic device 1000. The anti-reflective film 100 may be the anti-reflective film 100 of FIG. 1. Accordingly, a detailed description of the anti-reflective film 100 will be omitted. In some cases, the electronic device 1000 may include a separate cover glass, and the anti-reflective film 100 may be attached to an upper surface of the separate cover glass. In addition, as described above, a plurality of configurations such as the lens barrel, the actuator, and a filter may be disposed between the anti-reflective film 100 and the semiconductor chip 200, and an air layer such as a nitrogen ($N_2$) layer may be disposed among the plurality of configurations.

For reference, the anti-reflective film 100 is illustrated in FIG. 21 as being relatively large in size for convenience in understanding. As described in the anti-reflective film 100 of FIG. 1, a size of the anti-reflective film 100 may be actually very small compared to a whole size of the electronic device 1000. An identical concept may be applied to the electronic devices below.

Since the electronic device 1000 according to the present exemplary embodiment, e.g., the camera device, includes the anti-reflective film 100 of FIG. 1 as the outermost transparent cover layer, a reflectance of the outermost transparent cover layer may be minimized to optimize the performance of the camera device. Further, characteristics, e.g., wear resistance and chemical resistance, according to a surface hardness may increase to significantly improve the durability of the camera device.

In the electronic device 1000 according to the present exemplary embodiment, one of camera devices with various structures is simplified, and the present exemplary embodiment is not limited to the structure of the electronic device 1000 of FIG. 21. Therefore, it will be understand that all types of camera devices including the anti-reflective film 100 of FIG. 1 as the outermost transparent cover layer are within the technical scope of the example embodiments. In addition, it will be understood that camera devices including the anti-reflective films of FIGS. 2 to 4C and 8 to 20, as well as the anti-reflective film 100 of FIG. 1, also are within the technical scope of the example embodiments. Furthermore, it will be understood that camera devices including an anti-reflective film with the moth-eye pattern and having a high hardness of 4H or more also is within the technical scope of the example embodiments.

FIGS. 22 to 25 are cross-sectional views of electronic devices 1000a, 1000b, 1000c, and 1000d respectively including different types of anti-reflective films 100c, 100f, 100k, and 100m, according to another exemplary embodiment. The description provided in FIGS. 1, 4A, 10, 15, 17, and 21 will be simplified or omitted for convenience in description.

Figure 22:
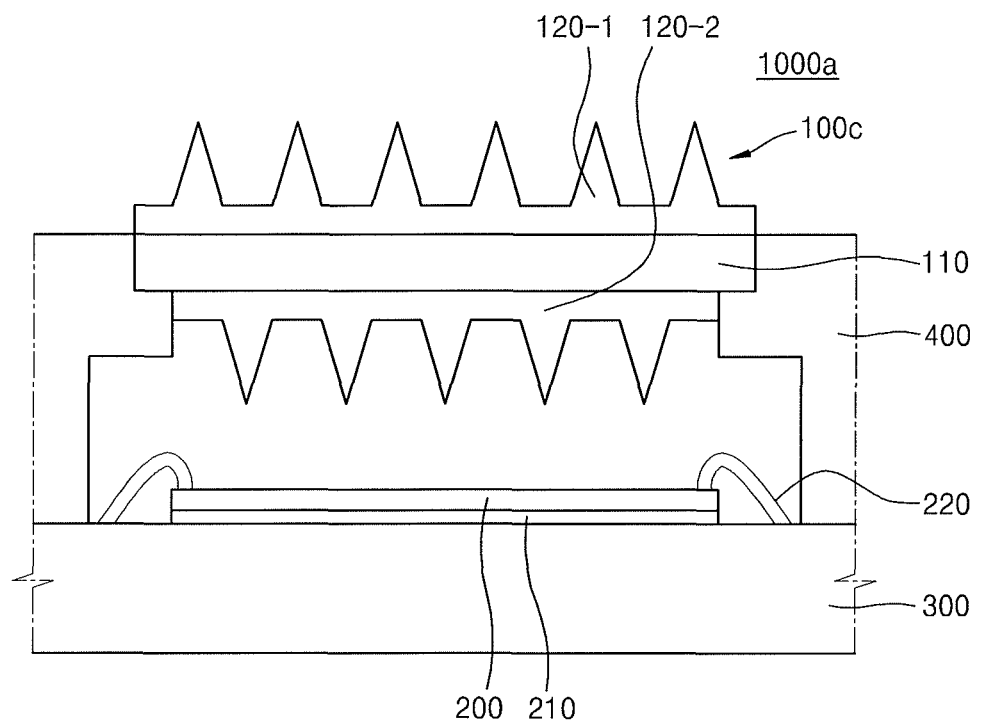
FIGS. 22 to 25 illustrate cross-sectional views of electronic devices respectively including different types of anti-reflective films, according to other exemplary embodiments.

Referring to FIG. 22, the electronic device 1000a according to the present exemplary embodiment may be a similar camera device as the electronic device 1000 of FIG. 21. Unlike the electronic device 1000 of FIG. 21, the electronic device 1000a according to the present exemplary embodiment may include the anti-reflective film 100c of FIG. 4A as a transparent cover layer instead of the anti-reflective film 100 of FIG. 1.

In the anti-reflective film 100c of FIG. 4A, high hardness coating layers 120-1 and 120-2 may be disposed on upper and lower surfaces of a transparent substrate 110, respectively. Accordingly, reflection characteristics of the electronic device 1000a may be improved. That is, the electronic device 1000a according to the present exemplary embodiment may include the anti-reflective film 100c of FIG. 4C, thereby significantly decreasing a reflectance and significantly increasing a transmittance.

Figure 23:
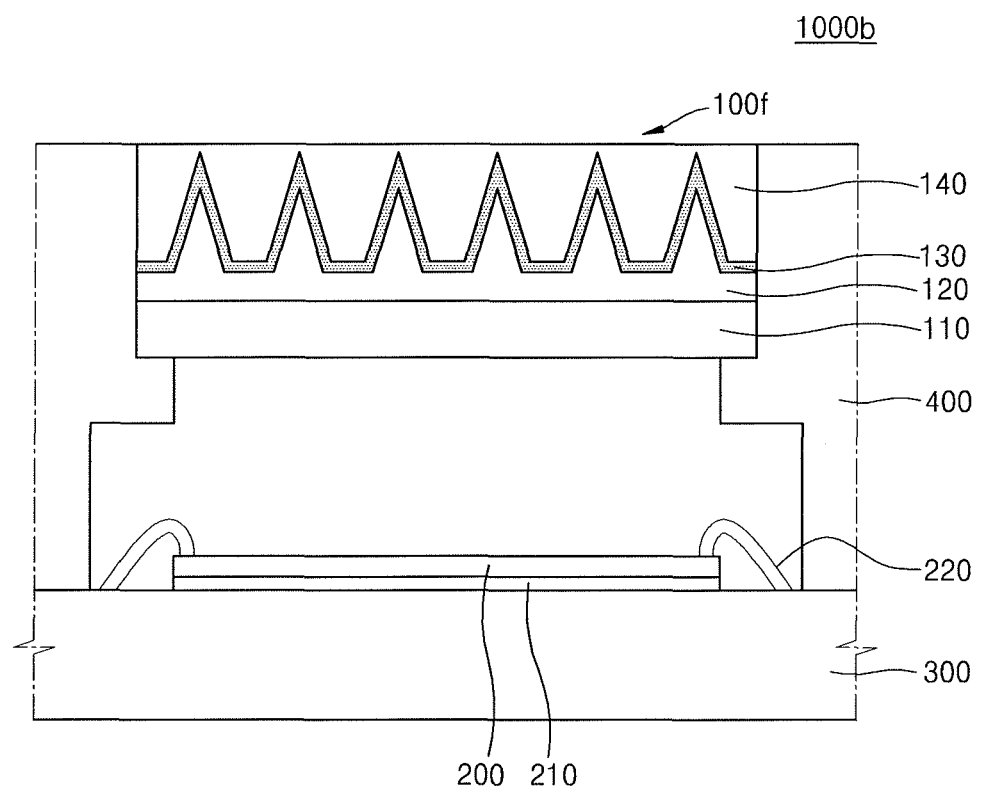

Referring to FIG. 23, the electronic device 1000b according to the present exemplary embodiment may differ from the electronic device 1000 of FIG. 21 in that the electronic device 1000b includes the anti-reflective film 100f of FIG. 10 as a transparent cover layer. For example, in the electronic device 1000b according to the present exemplary embodiment, the anti-reflective film 100f may include first and second protection layers 130 and 140 on a high hardness coating layer 120. As described above, the first and second protection layers 130 and 140 may be disposed on the high hardness coating layer 120, thereby improving an antireflection function and a wear resistance function of the anti-reflective film 100f. In addition, special functions, e.g., an anti-finger or a chemical resistance, may be added to the first protection layer 130 and/or the second protection layer 140. Therefore, the performance and the durability of the electronic device 1000b, which includes the anti-reflective film 100f, may be improved.

Figure 24:
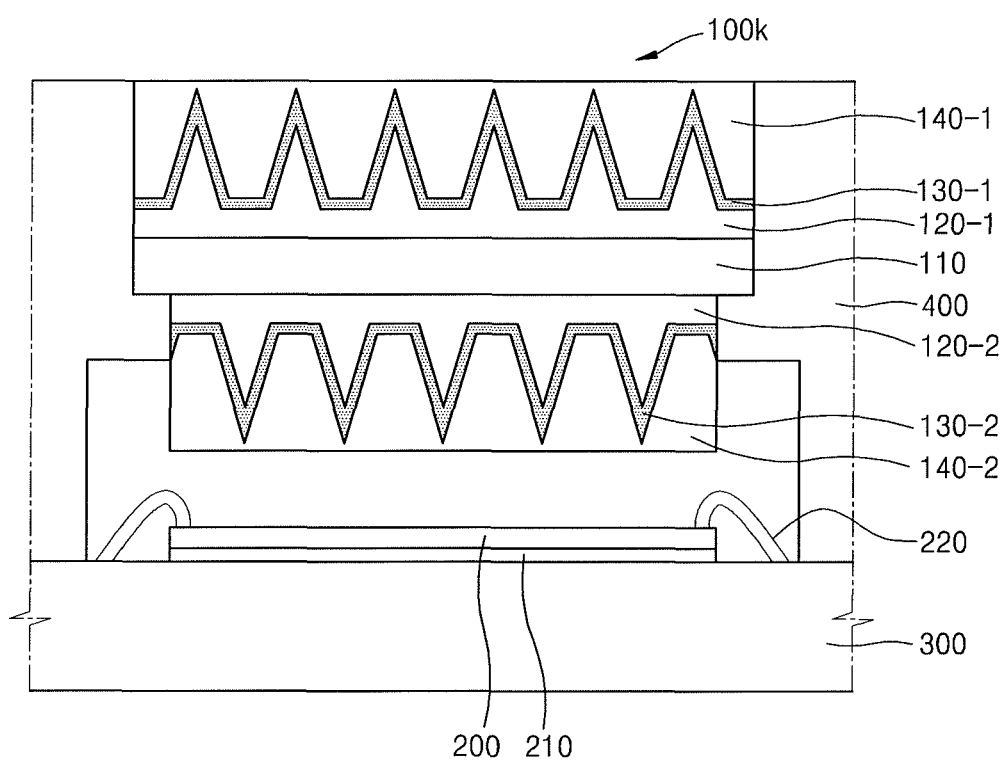

Referring to FIG. 24, the electronic device 1000c according to the present exemplary embodiment may differ from the electronic device 1000 of FIG. 21 in that the electronic device 1000c includes the anti-reflective film 100k of FIG. 15 as a transparent cover layer. For example, in the electronic device 1000c according to the present exemplary embodiment, the anti-reflective film 100k may include high hardness coating layers 120-1 and 120-2 on upper and lower surfaces of a transparent substrate 110, first protection layers 130-1 and 130-2, and second protection layers 140-1 and 140-2.

The high hardness coating layers 120-1 and 120-2 may be disposed on the upper and lower surfaces of the transparent substrate 110, thereby improving reflection characteristics of the anti-reflective film 100k. In addition, the first protection layers 130-1 and 130-2 and the second protection layers 140-1 and 140-2 may be disposed on the high hardness coating layers 120-1 and 120-2, thereby improving an anti-reflection function and a wear resistance function of the anti-reflective film 100k. In addition, special functions, e.g., an anti-finger or a chemical resistance, may be added to the first protection layers 130-1 and 130-2 and/or the second protection layers 140-1 and 140-2. Therefore, the performance and the durability of the electronic device 1000c, which includes the anti-reflective film 100k, may be improved.

Figure 25:
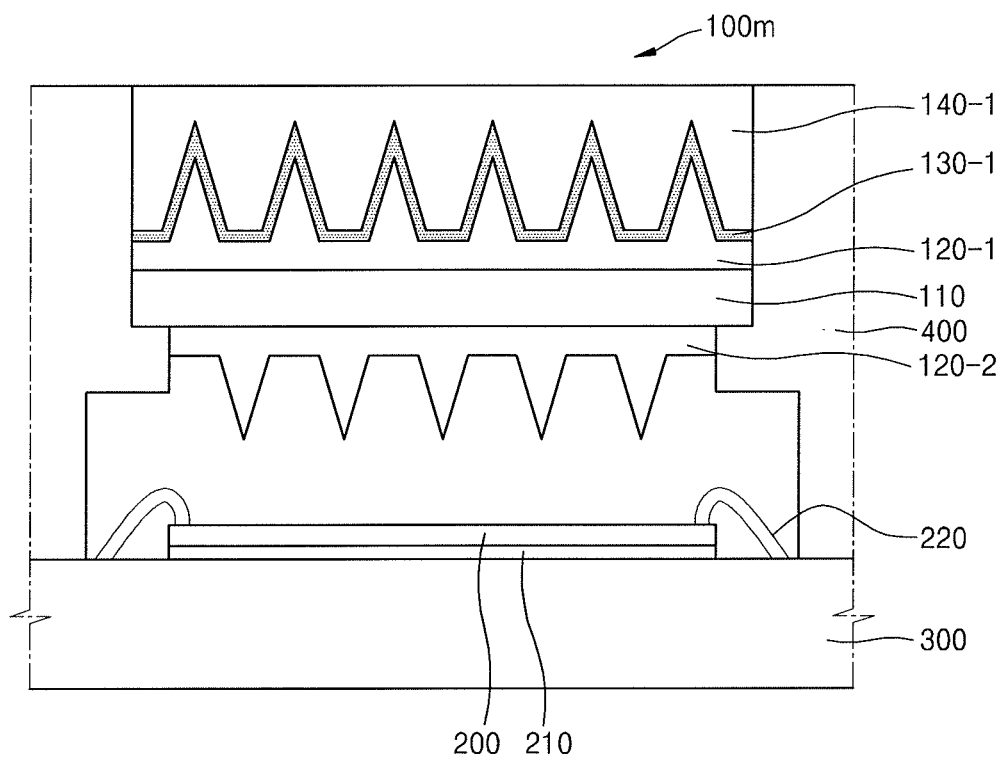

Referring to FIG. 25, the electronic device 1000d according to the present exemplary embodiment may differ from the electronic device 1000 of FIG. 21 in that the electronic device 1000d includes the anti-reflective film 100m of FIG. 17 as a transparent cover layer. For example, in the electronic device 1000d according to the present exemplary embodiment, the anti-reflective film 100m may include a first high hardness coating layer 120-1, a first upper protection layer 130-1, and a second upper protection layer 140-1 on an upper surface of a transparent substrate 110 and includes a second high hardness coating layer 120-2 in a lower surface thereof.

As described in the anti-reflective film 100m of FIG. 17, when the anti-reflective film 100m is applied to the electronic device 1000d such as a camera device, a portion exposed to the outside may be a portion of an upper surface side of the transparent substrate 110. Therefore, it may be required to improve characteristics such as a wear resistance and a chemical resistance of the upper surface side of the transparent substrate 110. Accordingly, the first and second upper protection layers 130-1 and 140-1 may be disposed on the first high hardness coating layer 120-1 of the upper surface side in the transparent substrate 110. As described above, the second high hardness coating layer 120-2 of a lower surface side in the transparent substrate 110 may contribute greatly to improve reflectance characteristics of the anti-reflective film 100m.

In addition, the first and second upper protection layers 130-1 and 140-2 may be disposed on the first high hardness coating layer 120-1, thereby improving an antireflection function and a wear resistance function of the anti-reflective film 100m. Furthermore, characteristics such as an anti-finger or a chemical resistance may be added to the first upper protection layer 130-1 and/or the second upper protection layer 140-1. Therefore, the performance and the durability of the electronic device 1000d, which includes the anti-reflective film 100m, may be further improved.

Figure 26:
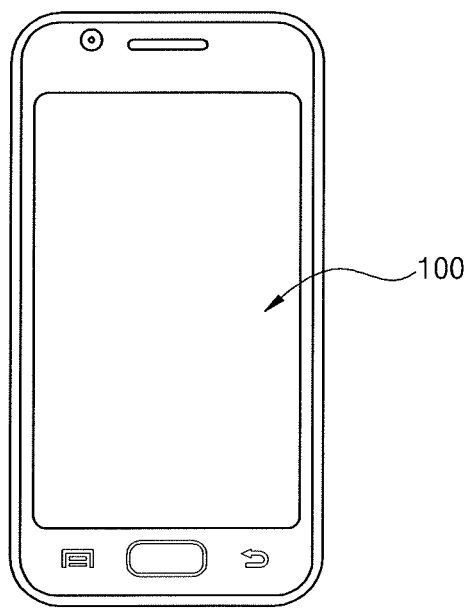
FIGS. 26 to 28 illustrate perspective views of electronic devices including anti-reflective films, according to other exemplary embodiments.
Figure 27:
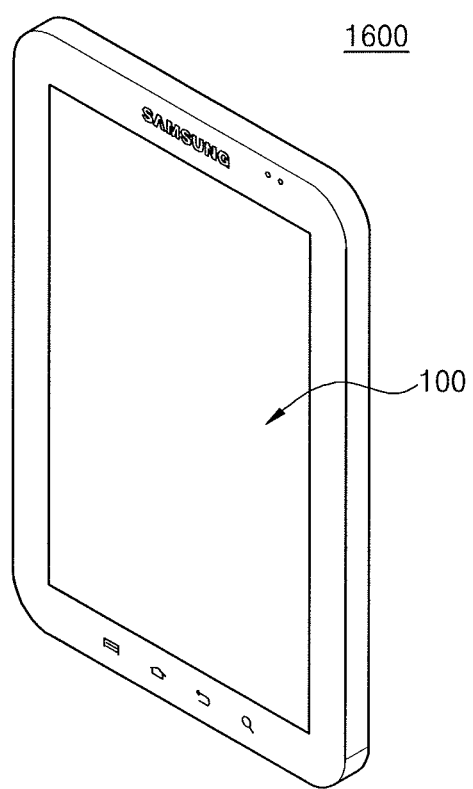
Figure 28:
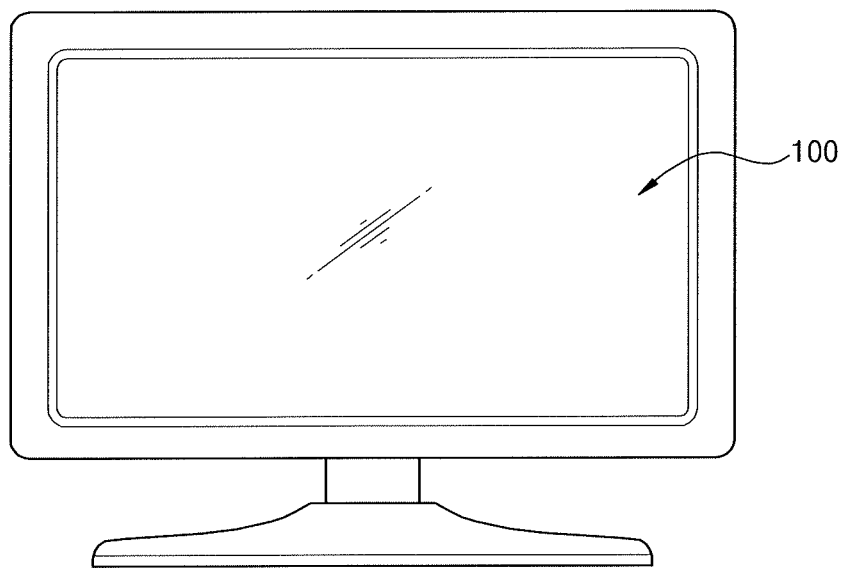

FIGS. 26 to 28 are perspective views of electronic devices 1500, 1600, and 1700 including anti-reflective films, according to an exemplary embodiment. The description provided in FIG. 1 will be simplified or omitted for convenience in description.

Referring to FIGS. 26 to 28, the electronic device 1500 is illustrated in FIG. 26 as a smartphone, the electronic device 1600 is illustrated in FIG. 27 as a tablet PC, and the electronic device 1700 is illustrated in FIG. 28 as a liquid crystal display television (LCD TV). The electronic devices 1500, 1600, and 1700 according to the present exemplary embodiments may be largely categorized as display devices and may commonly include a display screen for outputting an image. In addition, the electronic devices 1500, 1600, and 1700 according to the present exemplary embodiments may include the anti-reflective film 100 of FIG. 1 on the display screen.

The anti-reflective film 100 may be independently applied to the display screen of each of the electronic devices 1500, 1600, and 1700 as a transparent cover layer. In addition, each of the electronic devices 1500, 1600, and 1700 may include a separate cover glass on the display screen, and the anti-reflective film 100 may be additionally applied to the separate cover glass in a manner of being attached to the separate cover glass.

In the electronic devices 1500, 1600, and 1700 according to the present exemplary embodiments, the anti-reflective film 100 of FIG. 1 may be applied to the display screen, thereby improving reflection characteristics, a wear resistance function, and a chemical resistance function. Therefore, due to a decrease in reflectance, the electronic devices 1500, 1600, and 1700 according to the present exemplary embodiments may output clear light and a clear color, thereby improving screen display characteristics, and considerably increasing durability due to a wear resistance function and a chemical resistance function.

The electronic devices 1500, 1600, and 1700 according to the present exemplary embodiments may include the anti-reflective film 100 of FIG. 1 but is not limited thereto. The electronic devices 1500, 1600, and 1700 may include any one of the anti-reflective films of FIGS. 1 to 4C and 8 to 20. In addition, the present exemplary embodiments are not limited to the structures or types of the electronic devices 1500, 1600, and 1700 of FIGS. 26 to 28 and may include all types of electronic devices, each of which includes a display screen. Various anti-reflective films according to the present exemplary embodiments described above may be applied to the display screen of each of the all types of electronic devices.

FIGS. 29A to 29F are cross-sectional views for describing stages in methods of manufacturing the anti-reflective films 100, 100d, and 100f, according to an exemplary embodiment. The description provided in FIGS. 1, 8, and 10 will be simplified or omitted for convenience in description.

Figure 29A:
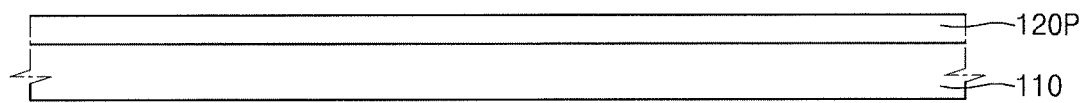
FIGS. 29A to 29F illustrate cross-sectional views for describing stages in a method of manufacturing an anti-reflective film according to an exemplary embodiment.

Referring to FIG. 29A, an initial coating layer 120P for forming a high hardness coating layer may be formed on the transparent substrate 110. The transparent substrate 110 may include at least one of a tempered glass, a transparent film, fused silica, quartz, glass, a polymer, and a glass wafer. The transparent substrate 110 may have a medium reflectance that is, e.g., in the range of about 1.45 to about 1.5. However, the material or reflectance of the transparent substrate 110 is not limited to those indicated above. Although not illustrated, the transparent substrate 110 may be disposed on a support substrate and may be supported by the support substrate.

The initial coating layer 120p may include a material that has high hardness characteristics and is easily imprinted. The initial coating layer 120P may include, e.g., at least one of a siloxane-based material including epoxy, a polysilazanes-based material, a PMMA-based material, SOG, and SOD. However, the material of the initial coating layer 120P is not limited to those indicated above. The initial coating layer 120P may be formed by, e.g., a spin coating process, an inkjet printing process, a roll coating process, or a slot die coating process. A process of forming the initial coating layer 120P is not limited to the above-described printing process and coating processes.

Figure 29B:
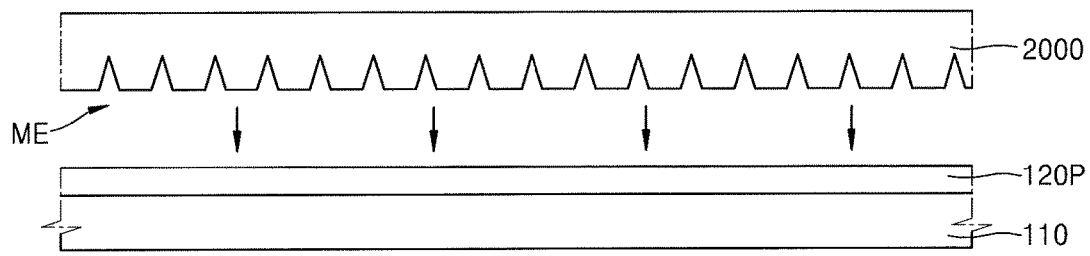
Figure 29C:
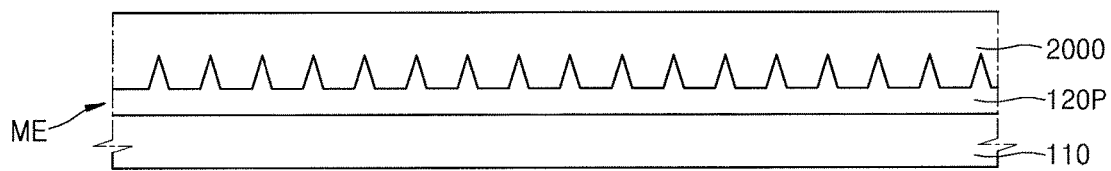
Figure 29D:
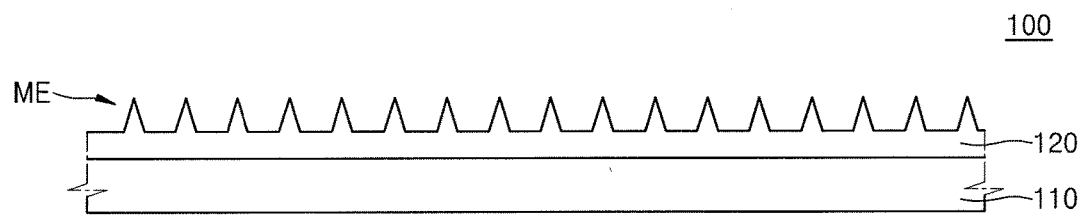

Referring to FIGS. 29B to 29D, a stamp 2000 with a fine moth-eye pattern ME may be prepared, and the fine moth-eye pattern ME of the stamp 2000 may be transferred onto the initial coating layer 120P through an imprinting process. The moth-eye pattern ME may have a size of several hundred nanometers. For example, the moth-eye pattern ME may have a structure in which concave portions with a height of about 280 nm are disposed at a pitch of about 250 nm, however, the size of the moth-eye pattern ME is not limited to the numerical values above.

The stamp 2000 may be a soft stamp that includes a polymer material. As illustrated in FIGS. 33A to 37, the stamp 2000 may be used in a belt shape due to soft characteristics. The moth-eye pattern ME on the stamp 2000 may be formed by using a roll or a master substrate, on which a pattern corresponding to the moth-eye pattern ME is formed. The roll and the master substrate will be described in more detail with reference to FIGS. 30A to 32B.

The imprinting process may be performed by pressing, onto the initial coating layer 120P, a surface of the stamp 2000, on which the moth-eye pattern ME is formed (FIG. 29C). A heat-treatment may be performed at a temperature of about 80° C. to about 100° C. to reduce a viscosity of the initial coating layer 120P such that the moth-eye pattern ME of the stamp 2000 is easily transferred onto the initial coating layer 120P.

After the moth-eye pattern ME is transferred onto the initial coating layer 120P through the imprinting process, the stamp 2000 may be separated from the initial coating layer 120P, or a curing treatment may be performed in a state in which the stamp 2000 is coupled to the initial coating layer 120P. In the method of manufacturing the anti-reflective film according to the present exemplary embodiment, the curing treatment may be performed by irradiating pulsed ultraviolet (UV) light on the initial coating layer 120P. The curing treatment by using the pulsed UV light may prevent deformation of the transparent substrate 110 under the initial coating layer 120P by inducing low-temperature-curing with respect to a high-temperature-cured material, e.g., the initial coating layer 120P. In addition, the curing treatment by using the pulsed UV light may rapidly cure the initial coating layer 120P, thereby significantly reducing a process time for forming the moth-eye pattern ME on the initial coating layer 120P.

For example, in order to obtain required curing characteristics, an existing curing treatment may be performed at a temperature of about 350° C. to about 1,200° C. for one (1) hour or more. In contrast, in the method of manufacturing the anti-reflective film according to the present exemplary embodiment, the required curing characteristics may be obtained by performing the curing treatment for only six (6) minutes or less by using the pulsed UV light. Therefore, in the method of manufacturing the anti-reflective film according to the present exemplary embodiment, the process time for the curing treatment may be reduced to about one-tenth (1/10) of the existing curing treatment by using the pulsed UV light.

The initial coating layer 120p may be changed into a high hardness coating layer 120 through the curing treatment. As illustrated in FIG. 29D, the high hardness coating layer 120 may include the moth-eye pattern ME on a surface thereof. The high hardness coating layer 120 may be formed on the transparent substrate 110, so that the anti-reflective film 100 of FIG. 1 may be manufactured. After the curing treatment, the stamp 2000 may be separated from the high hardness coating layer 120 or may be separated from the coating layer 120P before the curing treatment as described above.

Figure 29E:
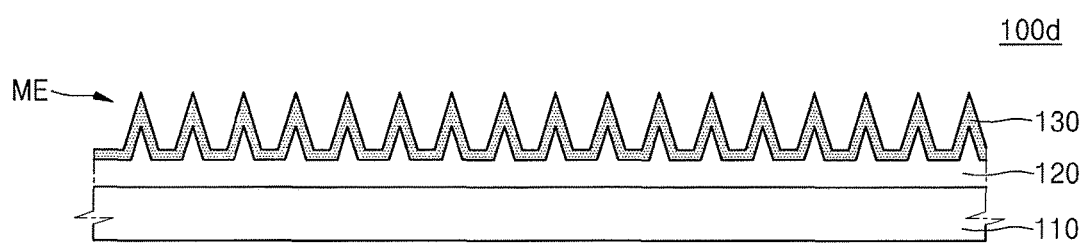

Referring to FIG. 29E, after the high hardness coating layer 120 is formed, the first protection layer 130 may be formed on the high hardness coating layer 120. The first protection layer 130 may have a structure surrounding the moth-eye pattern ME of the high hardness coating layer 120 and may be formed so as to have a very thin thickness. Therefore, the first protection layer 130 may be uneven, e.g., tracing the convex portion A and the concave portion B of the moth-eye pattern ME. As the first protection layer 130 is formed, the anti-protection layer 100d of FIG. 8 may be manufactured.

The first protection layer 130 may be formed through various processes, e.g., an atomic layer deposition (ALD) process, a laser deposition process, a sputtering process, an evaporation process, a spin coating process, a dip coating process, a slot die coating process, and a lamination coating process. As described above, the first protection layer 130 may provide a function for protecting the moth-eye pattern ME, a function as an anti-finger coating layer, a function for improving a surface hardness, or a function for a chemical resistance.

Figure 29F:
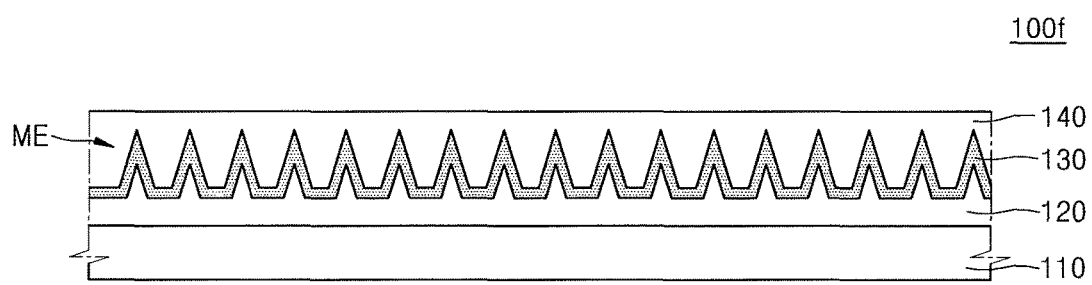

When the first protection layer 130 constitutes an outermost layer, the first protection layer 130 may include a material that has a low refractive index, and when the second protection layer 140 is further formed on the first protection layer 130, as in FIG. 29F, the first protection layer 130 may include a material that has a certain degree of high refractive index. Since the first protection layer 130 is formed so as to have a very thin thickness, even when the first protection layer 130 constitutes the outermost layer, like a DLC coating layer, the first protection layer 130 may include a material that has a certain degree of high refractive index.

Referring to FIG. 29F, after the first protection layer 130 is formed, the second protection layer 140 may be formed on the first protection layer 130. The second protection layer 140 may be formed so as to have a structure that covers the first protection layer 130, covers a convex portion thereof, and fills a concave portion thereof, and an upper surface of the second protection layer 140 may be flat and smooth. As the second protection layer 140 is formed, the anti-protection layer 100f of FIG. 10 may be manufactured.

The second protection layer 140 may function to protect the moth-eye pattern ME of the high hardness coating layer 120 and/or the first protection layer 130 and may provide a function as an anti-finger coating layer, a function for improving a surface hardness, or a function for a chemical resistance. The second protection layer 140 may include a material that has a relatively low refractive index, for example, a refractive index of less than about 1.45. The second protection layer 140 may be formed through at least one of, e.g., an atomic layer deposition (ALD) process, a laser deposition process, a chemical vapor deposition (CVD) process, a sputtering process, an evaporation process, a spin coating process, a dip coating process, a slot die coating process, and a lamination coating process. When the second protection layer 140 is formed through the lamination coating process, like the anti-reflective film 100h of FIG. 12, unevenness may be slightly formed on an upper surface of the second protection layer 140.

While the method of manufacturing the anti-reflective films 100, 100d, and 100f of FIG. 1, 8, or 10 has been described, after the initial coating layer 120P is formed on both surfaces or a single surface of the transparent substrate 110, the various anti-reflective films according to exemplary embodiments may be implemented according to a structure of the moth-eye pattern, which is formed on the initial coating layer 120P.

Figure 30A:
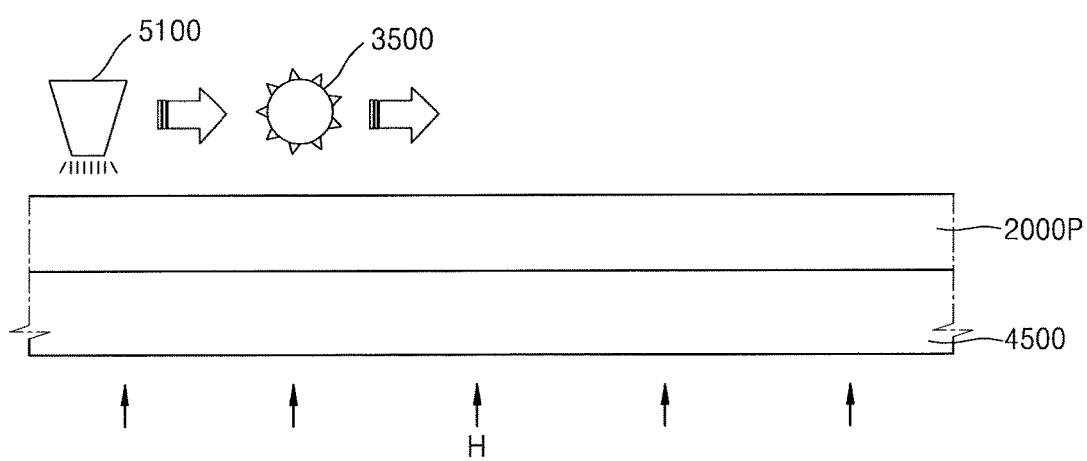
FIGS. 30A and 30B illustrate cross-sectional views for describing stages in a process of manufacturing a stamp including a moth-eye pattern, according to an exemplary embodiment.
Figure 30B:
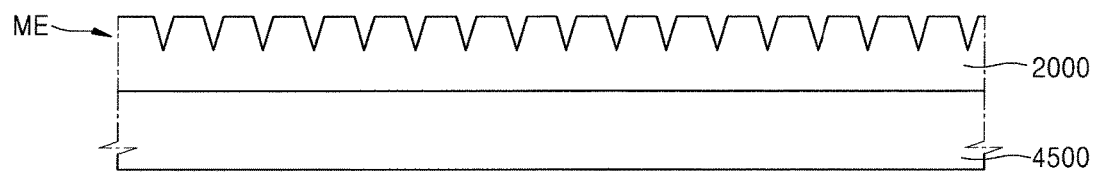

FIGS. 30A and 30B are cross-sectional views for describing a process of manufacturing the stamp 2000 including the moth-eye pattern ME, according to an exemplary embodiment.

Referring to FIG. 30A, a roller 3500 may be prepared, on a surface of which a pattern corresponding to the moth-eye pattern ME is formed, and an initial stamp 2000P may be disposed on a support substrate 4500. The initial stamp 2000P may include a soft polymer material. A heat-treatment H may be performed at an appropriate temperature to soften the initial stamp 2000P. As the roller 3500 moves, the pattern on the surface of the roller 3500 may be transferred onto the initial stamp 2000P. In addition, while a UV lamp 5100 follows the roller 3500, the UV lamp 5100 irradiates UV light on the initial stamp 2000P to cure the initial stamp 2000P. The heat-treatment H may be continuously performed while the roller 3500 moves. However, the heat-treatment H may be occasionally stopped before the roller 3500 moves. In addition, when the initial stamp 2000P is soft before curing, the heat-treatment H may be omitted.

Referring to FIG. 30B, after the pattern is transferred and a curing treatment is performed, as illustrated in FIG. 30B, the stamp 2000 may be manufactured, on which the moth-eye pattern ME is formed on a surface thereof. Even after the curing treatment is performed, the stamp 2000 may be a soft stamp that has a certain degree of soft characteristics. For reference, intaglio of the moth-eye pattern ME on the stamp 2000 may be formed in a direction that is opposite to a direction of intaglio of an actual moth-eye pattern ME on a high hardness coating layer 120. For example, a convex portion of the moth-eye pattern ME in the stamp 2000 may correspond to a concave portion of the actual moth-eye pattern ME in the high hardness coating layer 120.

Figure 31:
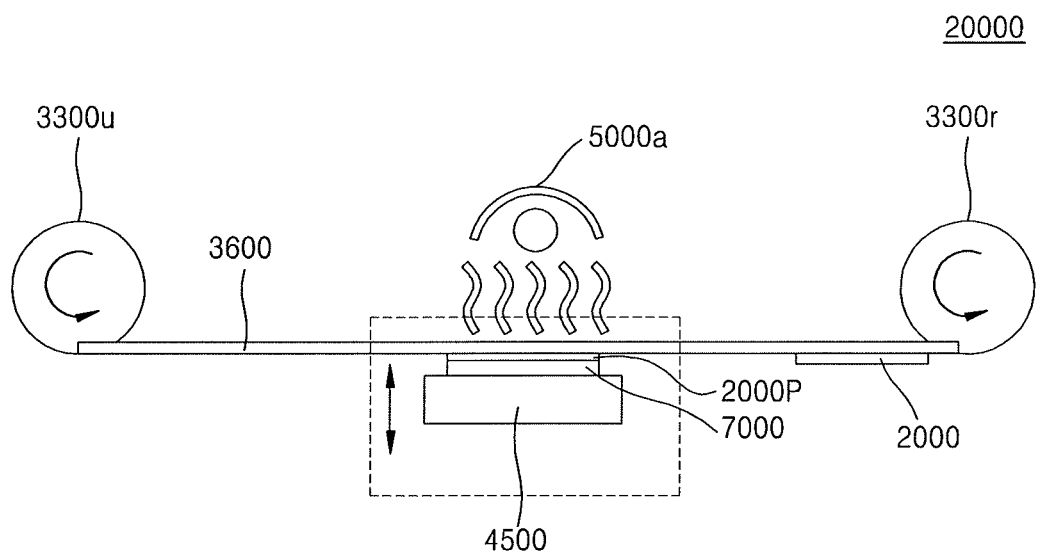
FIG. 31 illustrates a cross-sectional view for describing a process of manufacturing a stamp having a moth-eye pattern, according to another exemplary embodiment.

FIG. 31 is a cross-sectional view for describing a process of manufacturing a stamp 2000 having a moth-eye pattern, according to another exemplary embodiment.

Referring to FIG. 31, the process of the manufacturing the stamp 2000 according to the present exemplary embodiment may differ from the process of manufacturing the stamp 2000 of FIGS. 30A and 30B in that the process of the manufacturing the stamp 2000 uses a fixed master substrate 7000. In detail, the master substrate 7000, on an upper surface of which the moth-eye pattern is formed, may be disposed on the support substrate 4500, e.g., a chuck. A carrier film 3600 may be disposed on the master substrate 7000 so as to move through a winding operation of a rewinder 3300r and an unwinding operation of an unwinder 3300u.

Figure 32A:
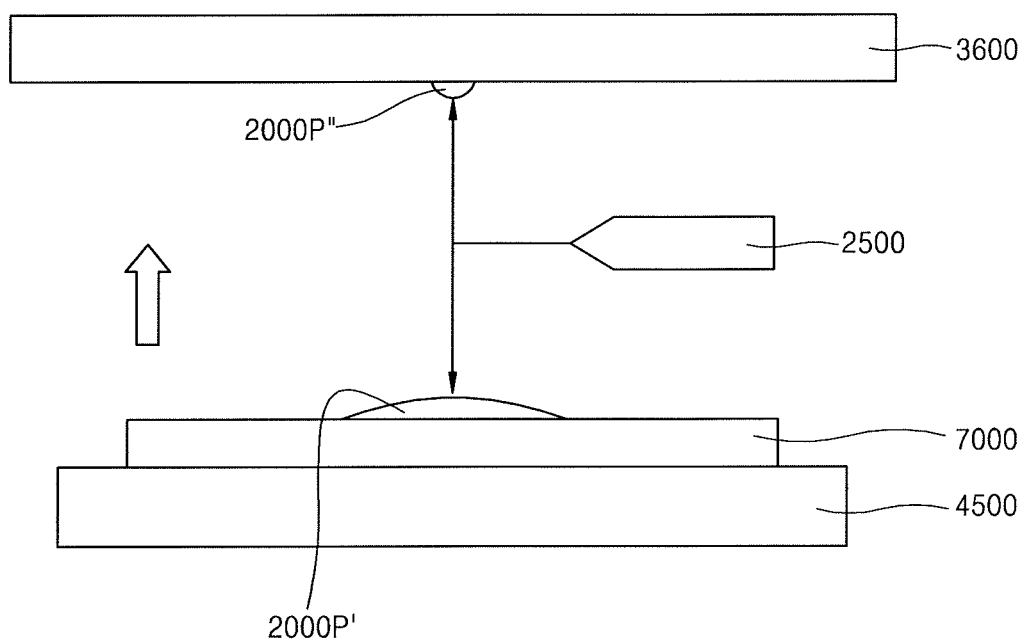
FIGS. 32A and 32B illustrate cross-sectional views for describing stages in a process of using first and second droplets applied to the process of manufacturing the stamp of FIG. 31.

After the master substrate 7000 is disposed, droplets of a polymer material for forming the stamp 2000 may be supplied on the upper surface of the master substrate 7000 by a dispenser (2500 of FIG. 32A). The support substrate 4500 may be elevated to press the master substrate 7000 onto the carrier film 3600. The droplets may be spread in a plate shape to form the initial stamp 2000P, and the moth-eye pattern on the upper surface of the master substrate 7000 may be transferred onto the initial stamp 2000P. A UV lamp 5000a may be disposed above the carrier film 3600 and may irradiate UV light on the initial stamp 2000P to perform curing.

When UV curing is ended, the support substrate 4500 and the master substrate 7000 may move downward, and the manufactured stamp 2000 including the moth-eye pattern may be maintained on the carrier film 3600. The manufactured stamp 2000 may move through the winding operation of the rewinder 3300r and the unwinding operation of the unwinder 3300u, and the aforementioned processes may be repeated to manufacture a new stamp.

Figure 32B:
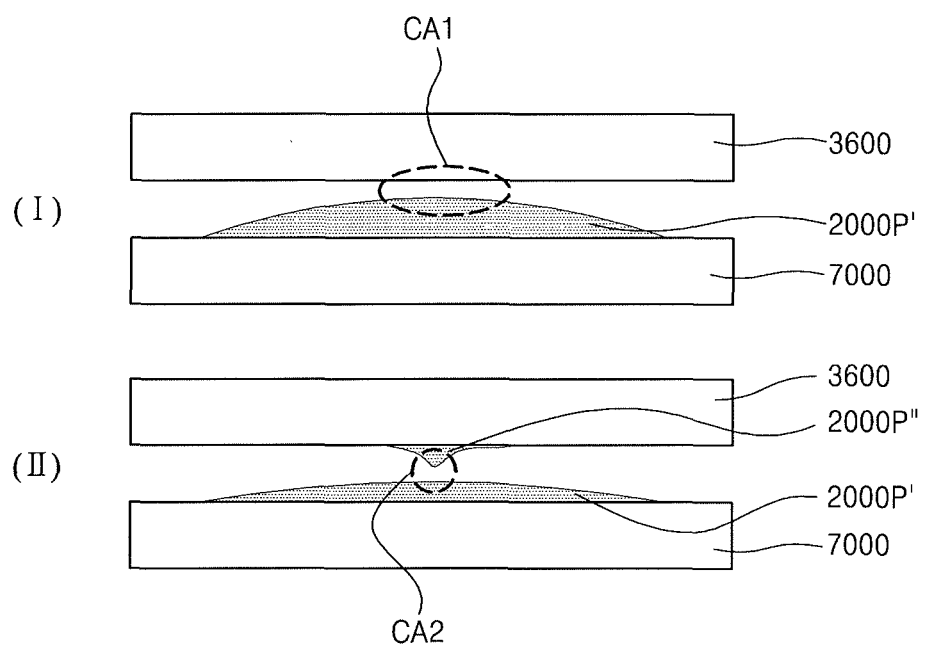

FIGS. 32A and 32B are cross-sectional views for describing a process of using first and second droplets 2000P' and 2000P'' applied to the process of manufacturing the stamp 2000 of FIG. 31.

Referring to FIG. 32A, when the first droplets 2000P' is supplied on the master substrate 7000 through a dispenser 2500, the second droplets 2000P'' may be supplied on the carrier film 3600 through the dispenser 2500. For example, large amounts of the first droplets 2000P' used as main droplets may be supplied on the master substrate 7000, and minute amounts of the second droplets 2000P'' may be supplied on the carrier film 3600.

As described above, after the first and second droplets 2000P' and 2000P'' are respectively supplied on the master substrate 7000 and the carrier film 3600, a good and strong quality stamp 2000 may be manufactured by moving the support substrate 4500 in an arrow direction to press the master substrate 7000 onto the carrier film 3600. The case of using the first and second droplets 2000P''' and 2000P'' will be described in detail with reference to FIG. 32B.

Referring to FIG. 32B, as in an upper portion (I), if the first droplets 2000P' are supplied only on the master substrate 7000, when the master substrate directly comes into contact with the carrier film 3600, air or foreign materials may be introduced between the master substrate 7000 and the carrier film 3600 because an initial contact area CA1 is excessively large. Accordingly, pressing and pattern transcription may be poor, thereby resulting in a poor stamp. In contrast, as in a lower portion (II), in a case in which minute amounts of the second droplets 2000P''' are supplied on the carrier film 3600, when the master substrate 7000 comes into contact with the carrier film 3600, an initial contact area CA2 may be very small due to the second droplets 2000P''', and a pressing process may be performed from a portion of the second initial contact area CA2, so that the pressing may be improved, the pattern transcription may be improved according to the pressing, and an excellent stamp 2000 may be manufactured.

Figure 33A:
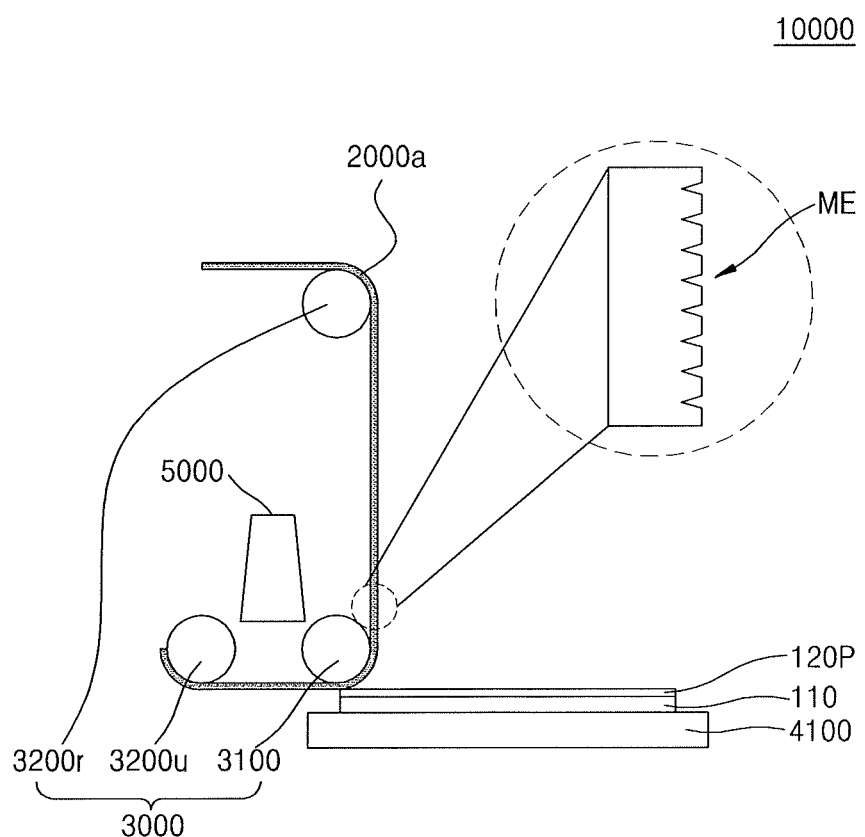
FIGS. 33A and 33B illustrate diagrams for describing an apparatus for manufacturing an anti-reflective film, according to an exemplary embodiment.
Figure 33B:
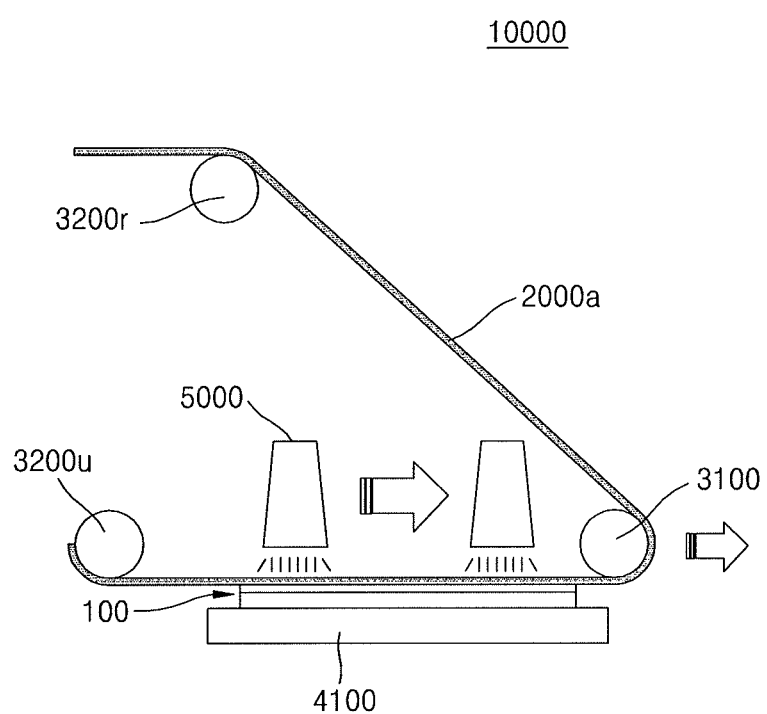

FIGS. 33A and 33B are diagrams for describing an apparatus 10000 for manufacturing the anti-reflective film 100, according to an exemplary embodiment.

Referring to FIGS. 33A and 33B, according to the present exemplary embodiment, the apparatus 10000 for manufacturing the anti-reflective film 100 may include a support substrate 4100, a stamp 2000a, a first rolling system 3000, and a UV lamp 5000.

The stamp 2000a may have a belt shape, and may be moved by the first rolling system 3000. As illustrated in an enlarged view inside the dashed circle in FIG. 33A, the moth-eye pattern ME may be formed on a lower surface of the stamp 2000a, i.e., on a surface of the stamp 2000a facing away from the first rolling system 3000.

The transparent substrate 110, on which an initial coating layer 120P is formed, may be disposed on the support substrate 4100. The support substrate 4100 may function to support and fix the transparent substrate 110 during a process of transferring the moth-eye pattern ME through an imprinting process.

The first rolling system 3000 may include a pressing roller 3100, an unwinder 3200u, and a rewinder 3200r. The first rolling system 3000 may function to move the stamp 2000a through a winding operation of the rewinder 3200r and an unwinding operation of the unwinder 3200u. In addition, as illustrated in FIG. 33B, the first rolling system 3000 may press the stamp 2000a onto the initial coating layer 120P on the transparent substrate 110 by using the pressing roller 3100 and may transfer the moth-eye pattern ME of the stamp 2000a onto the initial coating layer 120P, e.g., the pressing roller 3100 may roll in the horizontal direction (in the arrow direction) along a top surface of the initial stamp 120P to unwind the unwinder 3200u along the entire top surface of the initial stamp 120P.

As illustrated in FIG. 33B, the UV lamp 5000 may function to irradiate pulsed UV light on the initial coating layer 120P during the imprinting process. For example, while the UV lamp 5000 follows the pressing roller 3100 (along the horizontal direction), the UV lamp 5000 may irradiate the pulsed UV light on the initial stamp 120P to cure the initial stamp 120P.

As described above, the apparatus 10000 for manufacturing the anti-reflective film 100 according to the present exemplary embodiment may perform a curing treatment by using the pulsed UV light to complete the curing treatment within a very short time. In addition, the imprinting process may be continuously performed through the stamp 2000a with the belt shape and the first rolling system 3000, thereby easily forming a high hardness coating layer including the moth-eye pattern ME within a short time. Therefore, a process time for manufacturing the anti-reflective film 100 may be considerably reduced.

Figure 34A:
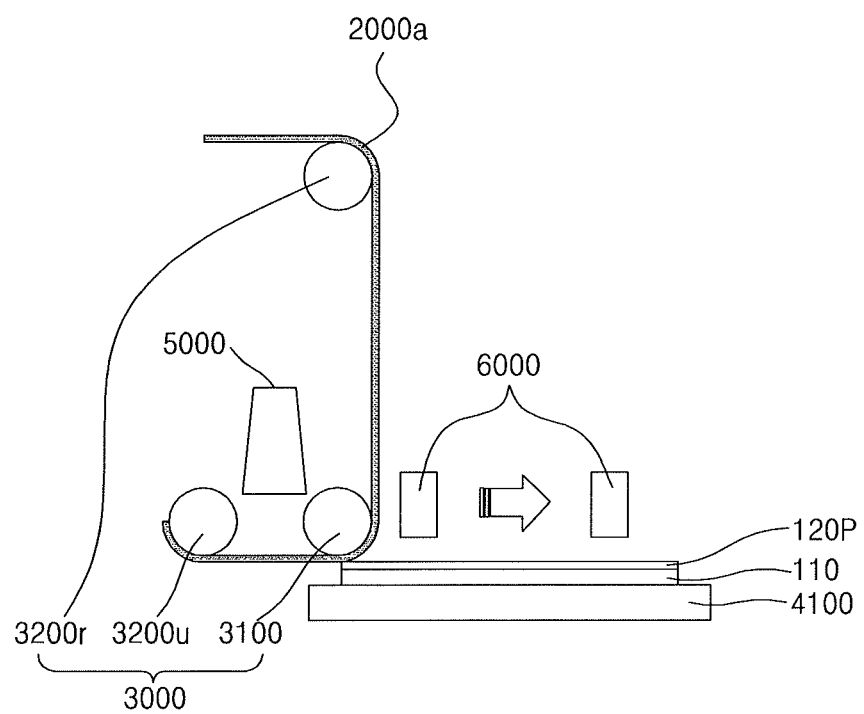
FIGS. 34A and 34B illustrate diagrams for describing an apparatus for manufacturing an anti-reflective film, according to another exemplary embodiment.
Figure 34B:
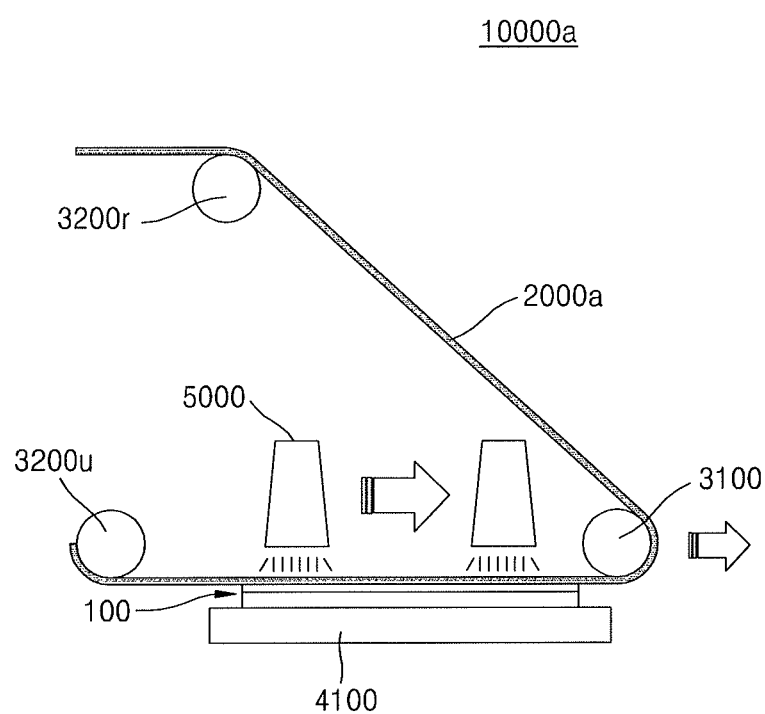

FIGS. 34A and 34B are diagrams for describing an apparatus 10000a for manufacturing an anti-reflective film 100, according to another exemplary embodiment. The description provided in FIGS. 33a and 33b will be simplified or omitted for convenience in description.

Referring to FIGS. 34A and 34B, the apparatus 10000a for manufacturing the anti-reflective film 100 according to the present exemplary embodiment may differ from the apparatus 10000 for manufacturing the anti-reflective film 100 of FIGS. 33A and 33B in that the apparatus 10000a further includes a coating device 6000. For example, in the apparatus 10000a for manufacturing the anti-reflective film 100 according to the present exemplary embodiment, an initial coating layer 120P may be formed on a transparent substrate 110 by using the coating device 6000, and a moth-eye pattern may be transferred onto the initial coating layer 120P through an imprinting process.

In other words, in the apparatus 10000 for manufacturing the anti-reflective film 100 of FIGS. 33A and 33B, the initial coating layer 120P may be previously formed on the transparent substrate 110 through an external coating device, and the transparent substrate 110 may be disposed on the support substrate 4500. In the apparatus 10000a of FIGS. 34A-34B for manufacturing the anti-reflective film 100 according to the present exemplary embodiment, the transparent substrate 110 may be disposed on the support substrate 4500, and coating may be performed through the coating device 6000 to form the initial coating layer 120P.

The coating device 6000 may be a device that performs coating through at least one of, e.g., a spin coating process, an inkjet printing process, a roll coating process, a slot die coating process, a blanket coating process, and a gravure coating process. However, the coating device 6000 is not limited to the device that performs the coating.

As illustrated in FIG. 34B, after the initial coating layer 120P is formed on the transparent substrate 110, processes to be performed may be substantially the same as in FIG. 33B. For example, the imprinting process may be performed by using the pressing roller 3100, and while the UV lamp 5000 follows the pressing roller 3100, a curing treatment may be performed by using pulsed UV light.

Figure 35:
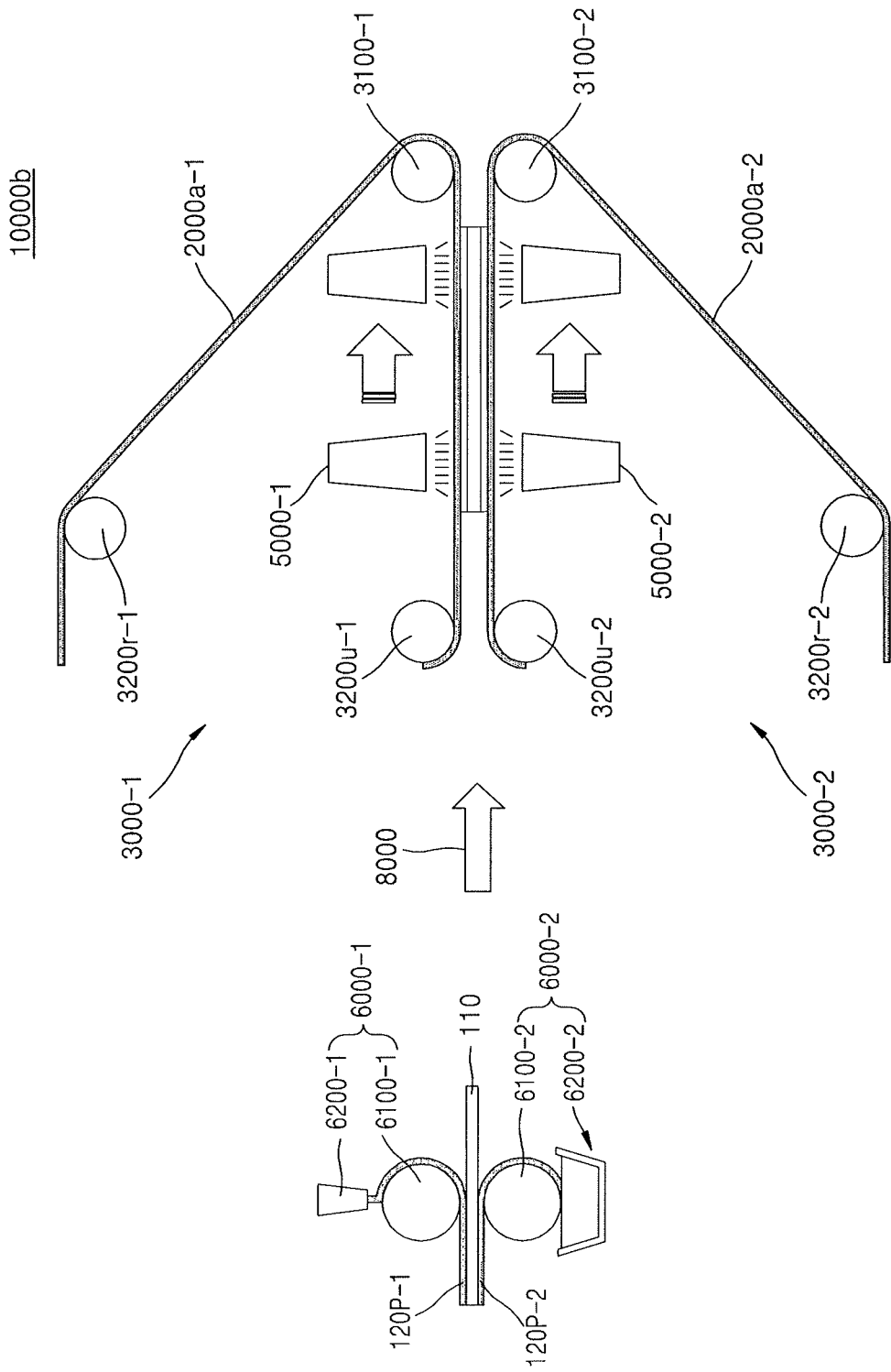
FIG. 35 illustrates a diagram for describing an apparatus for manufacturing an anti-reflective film, according to another exemplary embodiment.

FIG. 35 is a diagram for describing an apparatus 10000b for manufacturing an anti-reflective film, according to another exemplary embodiment. The description provided in FIGS. 33A and 33B will be simplified or omitted for convenience in description.

Referring to FIG. 35, the apparatus 10000b for manufacturing the anti-reflective film according to the present exemplary embodiment may differ from the apparatus 10000 for manufacturing the anti-reflective film 100 of FIGS. 33A and 33B in that high hardness coating layers 120 may be simultaneously formed on both surfaces of a transparent substrate 110. For example, the apparatus 10000b for manufacturing the anti-reflective film according to the present exemplary embodiment may include a moving device 8000, a first stamp 2000a-1, a second stamp 2000a-2, a first upper rolling system 3000-1, a first lower rolling system 3000-2, a first UV lamp 5000-1, and a second UV lamp 5000-2.

The moving device 8000 may function to move the transparent substrate 110 to the first upper and lower rolling systems 3000-1 and 3000-2, initial coating layers 120P-1 and 120P-2 being formed on both surfaces of the transparent substrate 110. The moving device 8000 may be indicated by a thick arrow for convenience. The moving device 8000 may be a conveyor belt system or a mobile robot. Of course, the moving device 8000 is not limited to the conveyor belt system or the mobile robot.

After the transparent substrate 110 is moved to the first upper and lower rolling systems 3000-1 and 3000-2 by the moving device 8000, the transparent substrate 110 may be disposed between the first upper rolling system 3000-1 and the first lower rolling system 3000-2, and as illustrated in FIG. 35, the transparent substrate 110 may be moved while an imprinting process is performed.

The first upper rolling system 3000-1 may include an upper unwinder 3200u-1, an upper rewinder 3000r-1, and an upper pressing roller 3100-1. The first lower rolling system 3000-2 may include a lower unwinder 3200u-2, a lower rewinder 3000r-2, and a lower pressing roller 3100-2. A structure and a function of each of the first upper and lower rolling systems 3000-1 and 3000-2 may be substantially the same as those described in the first rolling system 3000 of the apparatus 10000 for manufacturing the anti-reflective film 100 of FIGS. 33A and 33B.

In addition, the first and second UV lamps 5000-1 and 5000-2 may also be substantially the same as those described in the UV lamp 5000 of the apparatus 10000 for manufacturing the anti-reflective film 100 of FIGS. 33A and 33B.

Although not illustrated, a support device may be further disposed so as to support the transparent substrate 110 during the imprinting process. The support device may support the transparent substrate 110 at a side surface of the transparent substrate 110. When the first upper and lower rolling systems 3000-1 and 3000-2 stably support the transparent substrate 110, the support device may be omitted.

First and second coating devices 6000-1 and 6000-2 coating both sides of the transparent substrate 110 are illustrated in FIG. 35 as being disposed at the left of the moving device 8000, the first and second coating devices 6000-1 and 6000-2 may simultaneously form the initial coating layers 120P-1 and 120P-2 on both sides of the transparent substrate 110. The first and second coating devices 6000-1 and 6000-2 may be included or may not be included in the apparatus 10000b for manufacturing the anti-reflective film 100 according to the present exemplary embodiment.

The first and second coating devices 6000-1 and 6000-2 may be the same type of coating device or may be different types of coating devices. The different types of coating devices are illustrated in FIG. 35. For example, the first coating device 6000-1 may be a slot die coating device and may include an upper roller 6100-1 and a slot die 6200-1. In addition, the second coating device 6000-2 may be a roll coating device and may include a lower roller 6100-2 and a resin bath 6200-2 receiving a coating resin.

Figure 36:
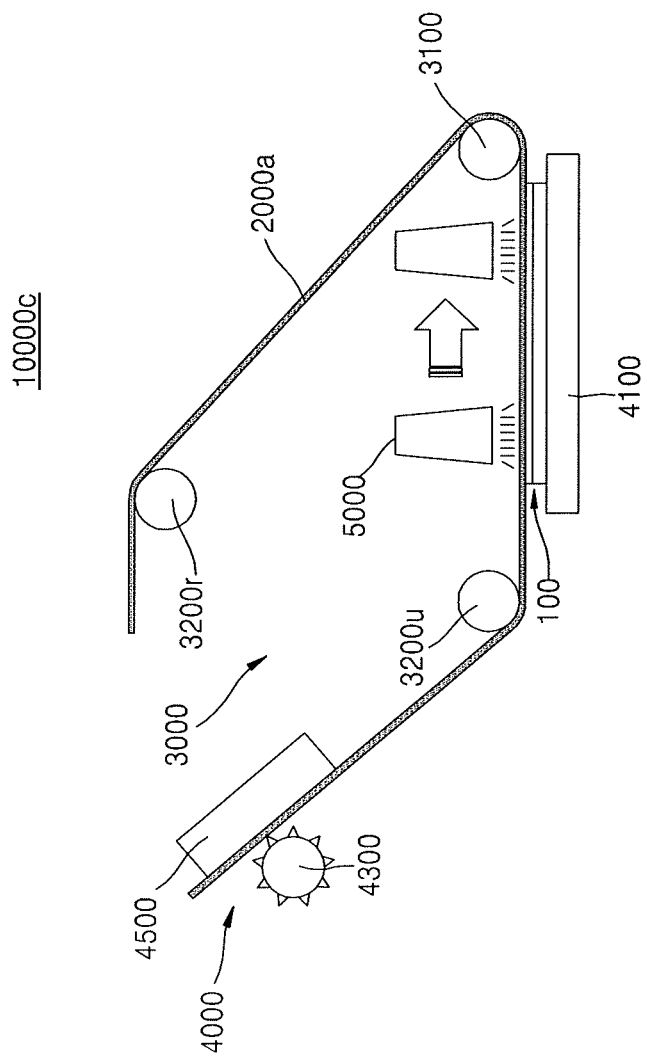
FIG. 36 illustrates a diagram for describing an apparatus for manufacturing an anti-reflective film, according to another exemplary embodiment.

FIG. 36 is a diagram for describing an apparatus 10000c for manufacturing an anti-reflective film 100, according to another exemplary embodiment. The description provided in FIGS. 33a and 33b will be simplified or omitted for convenience in description.

Referring to FIG. 36, the apparatus 10000c for manufacturing the anti-reflective film 100 according to the present exemplary embodiment may differ from the apparatus 10000 for manufacturing the anti-reflective film 100 of FIGS. 33A and 33B in that the apparatus 10000c further includes a second rolling system 4000 for forming a stamp 2000a.

The second rolling system 4000 may include a support substrate 4500 and a roller 4300. A pattern corresponding to a moth-eye pattern may be formed on a surface of the roller 4300. A process of manufacturing the stamp 2000a by using the roller 4300 may be substantially the same as the process of manufacturing the stamp 2000 described with reference to FIGS. 30A and 30B. The second rolling system 4000 may further include a separate UV lamp for curing, or the UV lamp 5000 used in the imprinting process may be used in manufacturing the stamp 2000a together.

According to the present exemplary embodiment, the apparatus 10000c for manufacturing the anti-reflective film 100 may include the second rolling system 4000, the manufacture of the stamp 2000a and the supply of the stamp 2000a to a first rolling system 3000 may be sequentially performed. Therefore, according to the present exemplary embodiment, the apparatus 10000c for manufacturing the anti-reflective film 100 may more rapidly and easily manufacture the anti-reflective film 100 including the moth-eye pattern.

Figure 37:
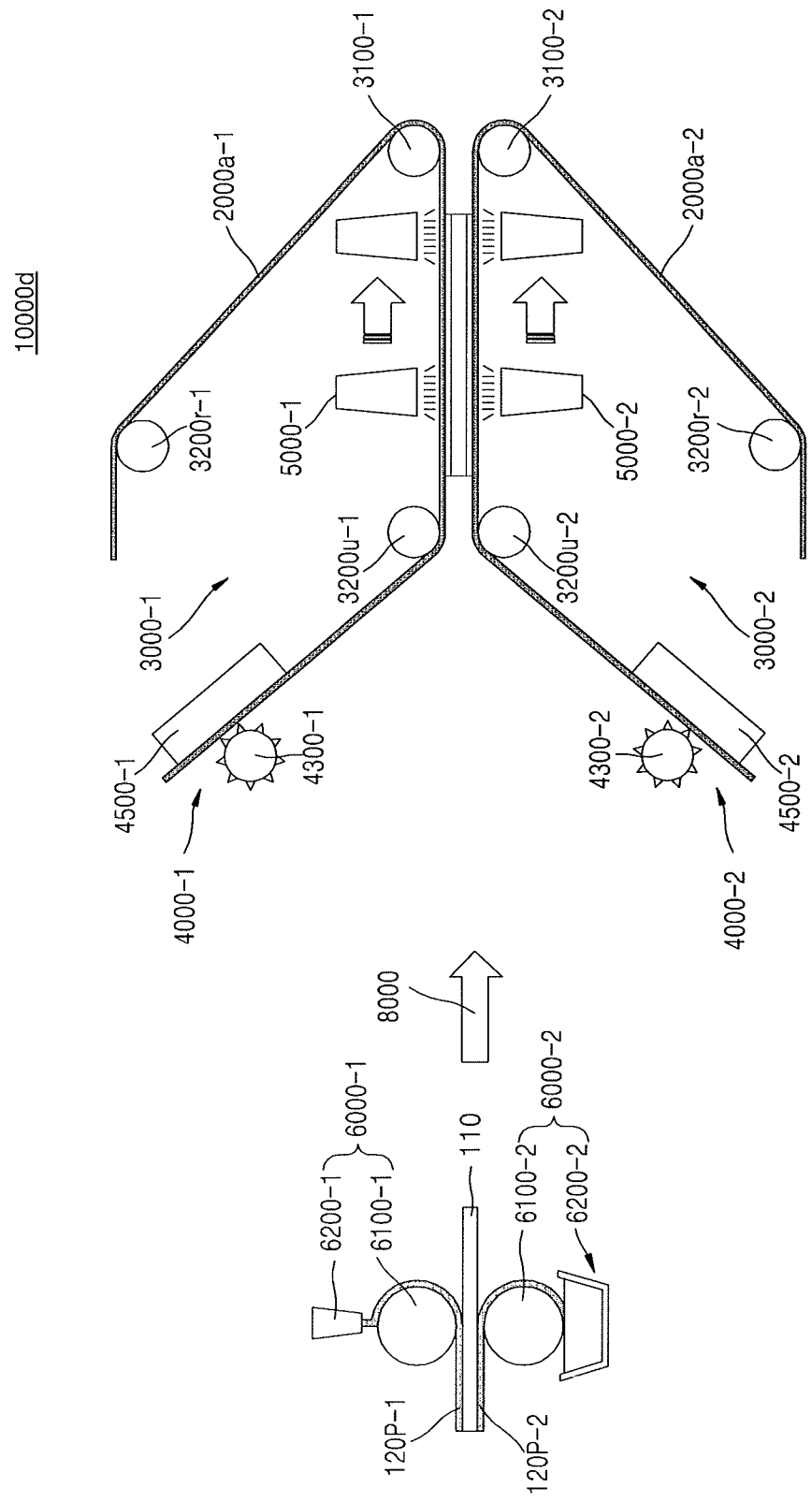
FIG. 37 illustrates a diagram for describing an apparatus for manufacturing an anti-reflective film, according to another exemplary embodiment.

FIG. 37 is a diagram for describing an apparatus 10000d for manufacturing an anti-reflective film, according to another exemplary embodiment. The description provided in FIGS. 33A, 33B, 35, and 36 will be simplified or omitted for convenience in description.

Referring to FIG. 37, the apparatus 10000d for manufacturing the anti-reflective film according to the present exemplary embodiment may differ from the apparatus 10000b for manufacturing the anti-reflective film 100 of FIG. 35 in that the apparatus 10000d further includes a second upper rolling system 4000-1 for forming a stamp 2000a-1 and a second lower rolling system 4000-2 for forming a stamp 2000a-2.

The second upper rolling system 4000-1 may include an upper support substrate 4500-1 and an upper roller 4300-1. In addition, the second lower rolling system 4000-2 may include a lower support substrate 4500-2 and a lower roller 4300-2. A pattern corresponding to a moth-eye pattern may be formed on a surface of each of the upper and lower rollers 4300-1 and 4300-2, and a process of manufacturing the stamps 2000a-1 and 2000a-2 by using the upper and lower rollers 4300-1 and 4300-2 may be substantially the same as the process of manufacturing the stamp 2000 described with reference to FIGS. 30A and 30B.

As described in the apparatus 10000b for manufacturing the anti-reflective film of FIG. 35, the first and second coating devices 6000-1 and 6000-2 may be included or may not be included in the apparatus 10000d for manufacturing the anti-reflective film according to the present exemplary embodiment. In addition, the first and second coating devices 6000-1 and 6000-2 may be the same type of coating device or may be different types of coating devices.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. An anti-reflective film, comprising:
a transparent substrate; and a high hardness coating layer on at least one of first and second surfaces of the transparent substrate, the high hardness coating layer having a uniform composition including a microscopic
structure less than a diffraction limit of $\lambda/2$ to $\lambda$ where $\lambda$ is a wavelength of light, and having a hardness of about 4H or higher and a moth-eye pattern.

2. The anti-reflective film as claimed in claim 1, further comprising a protection layer on the high hardness coating layer, the protection layer having a hardness equal to or greater than the hardness of the high hardness coating layer.

3. The anti-reflective film as claimed in claim 2, wherein the protection layer includes a first protection layer and a second protection layer, the first protection layer tracing an upper surface shape of the moth-eye pattern, and the second protection layer is on the first protection layer and fills a concave portion of the first protection layer.

4. The anti-reflective film as claimed in claim 3, wherein an upper surface of the second protection layer is flat.

5. The anti-reflective film as claimed in claim 3, wherein an upper surface of the second protection layer corresponds to a convex portion and the concave portion of the first protection layer.

6. The anti-reflective film as claimed in claim 3, wherein the second protection layer has a refractive index lower than a refractive index of the first protection layer.

7. The anti-reflective film as claimed in claim 2, wherein:
the protection layer is on the high hardness coating layer, and
the anti-reflective film further comprises an adhesion layer a surface of the transparent substrate opposite the high hardness coating layer, and a removable third protection layer on each of the adhesion layer and the protection layer.

8. The anti-reflective film as claimed in claim 1, wherein:
the high hardness coating layer is a homogeneous medium that includes at least one of a siloxane-based material, a polysilazane-based material, a polymethylmethacrylate (PMMA)-based material, a spin on glass (SOG), and a spin on dielectric (SOD), and
the siloxane-based material includes epoxy.

9. An electronic device, comprising:
at least one semiconductor chip;
a printed circuit board (PCB), the at least one semiconductor chip being on the PCB;
a holder on the PCB and surrounding the semiconductor chip, the holder including an open region; and
an anti-reflective film on the holder to cover the open region in the holder, the anti-reflective film including:
a transparent substrate; and
a high hardness coating layer on at least one of first and second surfaces of the transparent substrate, the high hardness coating layer having a uniform composition including a microscopic structure less than a diffraction limit of $\lambda/2$ to $\lambda$ where $\lambda$ is a wavelength of light, and having a hardness of about 4H or higher and a moth-eye pattern.

10. The electronic device as claimed in claim 9, wherein:
the first surface of the transparent substrate faces the semiconductor chip,
the high hardness coating layer is on each of the first and second surfaces of the transparent substrate, and
the anti-reflective film further comprises a protection layer on the high hardness coating layer above the second surface of the transparent substrate.

11. The electronic device as claimed in claim 10, wherein:
the protection layer includes a first protection layer and a second protection layer,
the first protection layer traces an upper surface shape of the moth-eye pattern,
the second protection layer is on the first protection layer, the second protection layer filling a concave portion of the first protection layer and covering a convex portion of the first protection layer, and
the second protection layer includes a first portion corresponding to the concave portion and a second portion corresponding to the convex portion.

12. The electronic device as claimed in claim 11, wherein, in the second protection layer, a height of an upper surface in the second portion is equal to or greater than a height of an upper surface in the first portion with respect to the second surface of the transparent substrate.

13. The electronic device as claimed in claim 11, wherein the first protection layer has a uniform thickness, and the second protection layer has a refractive index less than a refractive index of the first protection layer.

14. The electronic device as claimed in claim 9, further comprising a transparent cover layer on the holder, the anti-reflective film being attached to the transparent cover layer through an adhesion layer.

15. The electronic device as claimed in claim 9, wherein the electronic device is a camera device, a display device, or a camera-display device.

16. An anti-reflective film, comprising:
a transparent substrate; and
a high hardness coating layer on at least one surface of the transparent substrate, the high hardness coating layer including a plurality of protrusions arranged in a matrix pattern and facing away from the transparent substrate, the entirety of the high hardness coating layer having a uniform composition including a microscopic structure less than a diffraction limit of $\lambda/2$ to $\lambda$ where $\lambda$ is a wavelength of light, and exhibiting a hardness of at least 4H.

17. The anti-reflective film as claimed in claim 16, wherein the high hardness coating layer includes the plurality of protrusions on a base layer, the plurality of protrusions and base layer having a uniform hardness of above 4 H.

18. The anti-reflective film as claimed in claim 17, wherein the plurality of protrusions and the base layer are formed of a same material and are integral with each other.

19. The anti-reflective film as claimed in claim 18, wherein the protrusions and base layer of the high hardness coating layer include at least one of a polysilazane-based material, a polymethylmethacrylate (PMMA)-based material, a spin on glass (SOG), a spin on dielectric (SOD), and a siloxane-based material with an epoxy group.

20. The anti-reflective film as claimed in claim 16, wherein the high hardness coating layer is directly on the transparent substrate, and the plurality of protrusions in the high hardness coating layer have a height larger than a pitch.

* * * * *